(12) United States Patent
Ikeda et al.

(10) Patent No.: US 6,992,421 B2
(45) Date of Patent: Jan. 31, 2006

(54) PIEZOELECTRIC/ELECTROSTRICTIVE DEVICE AND METHOD OF MANUFACTURING SAME

(75) Inventors: Koji Ikeda, Hisai (JP); Fumitake Takahashi, Nagoya (JP); Kazuyoshi Shibata, Mizunami (JP); Haruhiko Itoh, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/866,927

(22) Filed: Jun. 14, 2004

(65) Prior Publication Data

US 2004/0251787 A1 Dec. 16, 2004

Related U.S. Application Data

(62) Division of application No. 10/341,543, filed on Jan. 13, 2003, now Pat. No. 6,809,459.

(30) Foreign Application Priority Data

Jan. 11, 2002 (JP) .............................. 2002-005289

(51) Int. Cl.
*H01L 41/04* (2006.01)
(52) U.S. Cl. ...................................... 310/328; 310/330
(58) Field of Classification Search ............ 310/313 B, 310/328, 330, 331, 321
See application file for complete search history.

(56) References Cited

U.S. PATENT DOCUMENTS

| | | | | |
|---|---|---|---|---|
| 5,729,074 A * | 3/1998 | Shiomi et al. | ............... | 310/309 |
| 5,977,689 A | 11/1999 | Neukermans | ............... | 310/324 |
| 6,217,979 B1 | 4/2001 | Takeuchi et al. | ............ | 428/138 |
| 6,333,681 B1 * | 12/2001 | Takeuchi et al. | ............ | 310/331 |
| 6,396,193 B1 | 5/2002 | Takeuchi et al. | ............ | 310/321 |
| 6,455,981 B1 | 9/2002 | Takeuchi et al. | ............ | 310/324 |
| 6,476,538 B2 | 11/2002 | Takeuchi et al. | ............ | 310/321 |
| 6,489,877 B1 * | 12/2002 | Yamamoto et al. | ......... | 336/200 |
| 6,497,474 B2 * | 12/2002 | Irinoda et al. | ................. | 347/54 |
| 6,504,287 B2 | 1/2003 | Yun et al. | .................... | 310/328 |
| 6,525,448 B1 | 2/2003 | Takeuchi et al. | ............ | 310/328 |
| 6,570,297 B1 | 5/2003 | Takeuchi et al. | ............ | 310/328 |
| 6,700,311 B2 | 3/2004 | Hammer et al. | ............ | 310/363 |

FOREIGN PATENT DOCUMENTS

| | | |
|---|---|---|
| EP | 1 089 357 A2 | 4/2001 |
| EP | 1 089 359 A2 | 4/2001 |
| EP | 2001-320099 A1 | 11/2001 |
| JP | 07235708 | 9/1995 |
| JP | 2001-320103 A1 | 11/2001 |

OTHER PUBLICATIONS

D.H. Pearce, et al., *Alternative Processing Routes for RAINBOW-Type Piezoelectric Devices,* Proceedings of the Eleventh IEEE International Symposium on Applications of Ferroelectrics, Aug. 1998, p. 547-549.

* cited by examiner

Primary Examiner—Dang Le
(74) Attorney, Agent, or Firm—Burr & Brown

(57) ABSTRACT

A pair of opposing thin plate sections, movable sections, and fixed sections for supporting the thin plate sections and the movable sections are provided on a ceramic substrate. After a wiring pattern and a gap or an insulating layer of cermet layer for filling the gap are formed on a ceramic substrate, these are sintered. After that, piezoelectric/electrostrictive layers and cermet electrode layers including a piezoelectric/electrostrictive material and a conductive material are alternately stacked in a comb like structure on the ceramic substrate. Accordingly, a piezoelectric/electrostrictive device having the piezoelectric/electrostrictive element in multilayer structure is obtained.

4 Claims, 24 Drawing Sheets

PIEZOELECTRIC/ELECTROSTRICTIVE DEVICE AND METHOD OF MANUFACTURING SAME

CROSS REFERENCE TO RELATED APPLICATIONS

This application is a division of U.S. application Ser. No. 10/341,543, filed Jan. 13, 2003 now U.S. Pat. No. 6,809,459, the entirety of which is incorporated herein by reference.

This application also claims the benefit of Japanese Application No. 2002-005289, filed Jan. 11, 2002, the entirety of which is incorporated herein by reference.

BACKGROUND OF THE INVENTION

1. Field of the Invention

The present invention relates to a piezoelectric/electrostrictive device comprising a ceramic substrate and at least a piezoelectric/electrostrictive element stacked on the ceramic substrate by means of a film formation method, and more particularly to a piezoelectric/electrostrictive device comprising a plurality of piezoelectric/electrostrictive layers and a plurality of electrode layers including a piezoelectric/electrostrictive material stacked alternately in a comb like structure on a ceramic substrate and to a method for producing the same.

2. Description of the Related Art

In a piezoelectric/electrostrictive device such as an actuator element and a sensor element including a piezoelectric/electrostrictive layer, firstly, a wiring pattern, which is composed of one electrode layer, is formed on a ceramic substrate by, printing for example. Secondly, the piezoelectric/electrostrictive layer is further formed on the wiring pattern by printing to secure the wiring pattern and the piezoelectric/electrostrictive layer to the ceramic substrate by sintering. After that, a wiring pattern, which is composed of the other electrode layer, is formed.

The piezoelectric/electrostrictive device is used as an actuator element in which an electric field is applied to the piezoelectric/electrostrictive layer by supplying an electric signal to the wiring pattern, and the piezoelectric/electrostrictive layer is consequently displaced. Additionally, the piezoelectric/electrostrictive device can be used as a sensor element in which an electric signal, which is generated depending on a pressure applied to the piezoelectric/electrostrictive layer, is extracted from the wiring pattern.

The piezoelectric/electrostrictive device as described above involves the following fear. That is, for example, the wiring pattern in the lower layer undergoes any thermal shrinkage, and a part of the wiring pattern is evaporated when the piezoelectric/electrostrictive layer is sintered. As a result, a lot of unnecessary pores appear in the wiring pattern and pores having large opening areas appear to decrease the portion (conductive portion) which actually functions as the electrode layer.

In such a situation, the area of the electrode layer is substantially decreased. Therefore, the capacitance is decreased and the driving force is lowered. Further, when unnecessary pores are generated irregularly due to the dispersion in the production, then the electrode areas of individual devices are dispersed, and the capacitance is also dispersed. This results in decreasing yield of the devices. Further, it is necessary that the control voltage is adjusted for every individual device when the device is used. A problem occurs in that such a device is difficult to be used (difficult to be controlled).

Further, the adhesive force is weak between the wiring pattern and the piezoelectric/electrostrictive layer. Therefore, any exfoliation occurs in some cases during the machining (for example, cutting and polishing) and/or during the washing (washing with ultrasonic wave) of the piezoelectric/electrostrictive device. In the case of the device as described above, the place, at which the exfoliation occurs, is the interface between the wiring pattern and the piezoelectric/electrostrictive layer.

Further, a portion, in which the electrode layer is not formed on the ceramic substrate, is provided in relation to the planar shape of the wiring pattern. At this portion, the ceramic substrate and the piezoelectric/electrostrictive layer are opposed to one another. However, any gap appears at the portion after the sintering, for the following reason. That is, it is difficult to join constitutive materials of the ceramic substrate and constitutive materials of the piezoelectric/electrostrictive layer.

If such a gap is formed, a part of the piezoelectric/electrostrictive layer consequently floats over the electrode layer. Such a portion exists as a region which is not restricted by the ceramic substrate. As a result, any movement tends to occur due to any external force in this structure. Therefore, the exfoliation is apt to take place.

In view of the above, in order that the piezoelectric/electrostrictive layer and the wiring pattern are not exfoliated from the ceramic substrate, for example, it is necessary that the step of cutting the piezoelectric/electrostrictive device is performed under a condition in which the load on the piezoelectric/electrostrictive layer or the like is decreased. That is, the cutting step is restricted by the condition in which the machining load is small. As a result, the machining time is prolonged, and the throughput is lowered.

On the other hand, it is necessary that the washing step is also performed under a condition in which the load on the piezoelectric/electrostrictive layer or the like is decreased. Therefore, in order to eliminate the dirt, it is necessary to use a longer period of washing time. As a result, the number of steps is increased.

When the exfoliation of the piezoelectric/electrostrictive layer or the like occurs, the following harmful influences also appear.

(1) The function as the piezoelectric/electrostrictive device is deteriorated.

(2) When the wiring pattern is exfoliated from the piezoelectric/electrostrictive layer, the capacitance is decreased. As a result, the amount of generation of strain is decreased in the piezoelectric/electrostrictive layer, and the displacement is decreased.

(3) When the wiring pattern is exfoliated from the ceramic substrate, then the strain, which is generated in the piezoelectric/electrostrictive layer, is hardly transmitted to the ceramic substrate, and the displacement is decreased.

(4) The strength of the entire piezoelectric/electrostrictive device is decreased, and the resonance frequency is lowered when the piezoelectric/electrostrictive device is used as an actuator element.

SUMMARY OF THE INVENTION

The present invention has been made taking the foregoing problems into consideration, an object of which is to provide a piezoelectric/electrostrictive device which makes it possible to increase the occupied area of a conductive portion in one electrode layer, which increases the driving force, which improves the yield, and which is easily controllable, and a method for producing the same.

Another object of the present invention is to provide a piezoelectric/electrostrictive device which makes it possible to effectively reduce the volume of a piezoelectric/electrostrictive element itself to decrease the resistance on the displacement action and which makes it possible to further increase the driving force (increase the displacement amount) in addition to the requirements described above, and a method for producing the same.

Still another object of the present invention is to provide a piezoelectric/electrostrictive device which makes it possible to prevent a piezoelectric/electrostrictive element formed on a ceramic substrate from exfoliation, reduce the number of steps in relation to the production of the piezoelectric/electrostrictive device, and improve the throughput and which also makes it possible to avoid the deterioration of function of the piezoelectric/electrostrictive device, and a method for producing the same.

Still another object of the present invention is to provide a piezoelectric/electrostrictive device which makes it possible to improve the shock resistance by increasing the breaking strength or fracture strength and which has high reliability, and a method for producing the same.

According to the present invention, there is provided a piezoelectric/electrostrictive device comprising a ceramic substrate and at least a piezoelectric/electrostrictive element stacked on the ceramic substrate; wherein the piezoelectric/electrostrictive element includes a plurality of piezoelectric/electrostrictive layers and a plurality of electrode layers stacked alternately in a comb like structure on the ceramic substrate, the electrode layer includes one or more intermediate electrode layers at an intermediate portion of the piezoelectric/electrostrictive element, the intermediate electrode layers are formed by sintering a cermet film containing a conductive material and a piezoelectric/electrostrictive material, and in at least one of the intermediate electrode layers, the conductive material shrinks in the sintering and forms a conductive portion occupying 80% or more of the intermediate electrode layer.

The area described above is herein defined as follows. That is, the maximum straight line lengths of the openings of the individual pores and the number (n) of the pores are measured within a range of a square having an area of 100 $\mu m^2$ on the electrode surface at a magnification of ×200 by using a metallographic microscope. Assuming that the shapes of the pores are circular, the pore area is calculated on condition that an average value (r) of the maximum straight line lengths of the openings is an average diameter. The calculated value is multiplied by the number (n) of the pores to obtain a multiplied value from which a pore area ratio (h) per 1 $mm^2$ is calculated. The expression of calculation is shown below.

$$h = n\pi(r/2)^2 \times 100/1 \text{ mm}^2$$

Usually, if the electrode layer is sintered singly or together with the piezoelectric/electrostrictive layer to secure the electrode layer to the piezoelectric/electrostrictive layer, then a large number of pores are generated, and/or pores having large opening areas are generated, for example, due to the partial evaporation and/or the thermal shrinkage of the electrode layer during the sintering. It is feared that the portion (conductive portion), which actually functions as the electrode layer, may be decreased. It is noted that the pores generated as described above are filled with the piezoelectric/electrostrictive material.

However, in the present invention, the intermediate electrode layer, which is disposed at the intermediate portion in the piezoelectric/electrostrictive element, is formed by sintering the cermet film containing the conductive material and the piezoelectric/electrostrictive material, and the area after the sintering of the conductive portion of one of the intermediate electrode layers disposed at the intermediate portion in piezoelectric/electrostrictive element occupies 80% or more of the intermediate electrode layer. Therefore, the unnecessary pores as described above are generated to a smaller extent.

Therefore, it is possible to increase the occupied area of the conductive portion of one electrode layer. Accordingly, the capacitance is increased, and the driving force is increased, and thus the displacement amount is increased as well.

The unnecessary pores are scarcely generated in the present invention as compared with a case in which the unnecessary pores are irregularly generated. Therefore, the dispersion of the area of the conductive portion of one electrode layer in the individual device is also decreased. Accordingly, the dispersion of capacitances among the individual devices is decreased. It is unnecessary that the control voltage is adjusted for every device one by one when the device is used. Thus, the device is conveniently usable (easily controllable).

Similarly, the dispersion of displacement characteristics of the individual devices is also decreased. Thus, it is possible to improve the accuracy in relation to the displacement amount.

The electrode layer included in the electrode layers for constituting the piezoelectric/electrostrictive element, which is disposed at the intermediate portion in the stacking direction, is formed by sintering the cermet film containing the conductive material and the piezoelectric/electrostrictive material. Therefore, a state is given, in which the electrode layer and the piezoelectric/electrostrictive layer are hardly exfoliated from each other.

Therefore, in the present invention, it is possible to avoid the exfoliation of the piezoelectric/electrostrictive element formed on the ceramic substrate, it is possible to reduce the number of steps in relation to the production of the piezoelectric/electrostrictive device, and it is possible to improve the throughput. Additionally, it is possible to avoid the deterioration of the function as the piezoelectric/electrostrictive device as well.

It is preferable that a range of a volume ratio between the conductive material and the piezoelectric/electrostrictive material is 4:6 to 9:1. Further, it is preferable that the intermediate electrode layer is formed as a conductor layer which is a film of 4 $\mu m$ or less in thickness. The volume ratio herein refers to the value which is calculated from masses and specific gravities or densities (provided that pores are excluded from values) of materials when the materials are blended.

In this arrangement, it is possible to thin the thickness of one electrode layer. Therefore, it is possible to effectively decrease the volume of the piezoelectric/electrostrictive element itself as well. Accordingly, it is possible to decrease the resistance on the displacement action, and it is possible to further increase the driving force (increase the displacement amount) in cooperation with the increase in capacitance.

It is preferable that the intermediate electrode layer is formed as a cermet conductor layer which is a film of 4 $\mu m$ or more in thickness. In this arrangement, even when the cermet electrode is 4 $\mu m$ or more and thick, it is possible to enhance the adhesive force with respect to the piezoelectric/electrostrictive layer as compared with a conductor layer made of a metal simple substance having the same thickness. Therefore, the exfoliation scarcely occurs, and this arrangement is advantageous to improve the reliability.

When the electrode layer, which is disposed at the intermediate portion in the stacking direction, is formed by sintering the cermet film containing the conductive material and the piezoelectric/electrostrictive material, the metal electrode layer is formed at a portion interposed between the piezoelectric/electrostrictive layers after the sintering. That is, the thin electrode layer based on metal is formed at the portion interposed between the piezoelectric/electrostrictive layers, because the piezoelectric/electrostrictive material component in the cermet film is moved to the piezoelectric/electrostrictive layer during the sintering, and the remaining metal material forms the electrode layer. In other words, the metal electrode layer is formed to be thinner than the cermet electrode layer. The electrode layer of the present invention is thin, it has a small number of pores, and it has the high adhesive force with respect to the piezoelectric/electrostrictive layer, as compared with a case in which the electrode layer is formed of a metal paste.

Further, it is preferable that one or more gaps of one or more lower electrode layers positioned at a lower portion of the piezoelectric/electrostrictive element is formed on the ceramic substrate and the gaps are filled with an insulating layer. In this arrangement, the insulating layer and the piezoelectric/electrostrictive layer formed as the upper layer of the insulating layer are strongly bonded. Accordingly, a state is given, in which the electrode layer and the insulating layer are hardly exfoliated from each other. Therefore, it is possible to avoid the exfoliation of the piezoelectric/electrostrictive layer formed on the electrode layer, and it is possible to sufficiently exhibit the function of the actuator element or the sensor element based on the use of the piezoelectric/electrostrictive layer.

It is also preferable that one or more electrode layers provided at an upper portion of the piezoelectric/electrostrictive element, are formed by depositing a film of resinate of a conductive material to the upper portion.

According to another aspect of the present invention, there is provided a piezoelectric/electrostrictive device comprising a ceramic substrate and a piezoelectric/electrostrictive element formed on the ceramic substrate; wherein the ceramic substrate includes fixed sections which have a large thickness and a pair of thin plate sections which are formed continuously from the fixed sections and each of which have a thickness thinner than that of the fixed sections; and each of the pair of thin plate sections are composed of two or more types of materials.

Accordingly, it is possible to increase the breaking strength or fracture strength of the pair of thin plate sections, and it is possible to improve the shock resistance. This results in the improvement in reliability of the piezoelectric/electrostrictive device.

It is also preferable to provide a piezoelectric/electrostrictive device comprising a ceramic substrate and a piezoelectric/electrostrictive element formed on the ceramic substrate; wherein the ceramic substrate includes fixed sections which have a large thickness and a pair of thin plate sections which are formed continuously from the fixed sections and which are thinner than the fixed section; and a second material is used between the pair of thin plate sections and the fixed sections.

Accordingly, the breaking strength is increased by the second material between the pair of thin plate sections and the fixed section. Thus, it is possible to improve the shock resistance of the entire piezoelectric/electrostrictive device.

When the ceramic substrate has a fixed section which has a large thickness, a pair of thin plate sections which are formed continuously from the fixed sections and which are thinner than the fixed sections, and movable sections which are provided at ends of the pair of thin plate sections, it is also preferable that a second material is used between at least the pair of thin plate sections and the fixed section and between the pair of thin plate sections and the movable sections.

Accordingly, the breaking strength is increased by the second material used between the pair of thin plate sections and the fixed sections and between the pair of thin plate sections and the movable sections. Thus, it is possible to improve the shock resistance of the entire piezoelectric/electrostrictive device.

In this arrangement, it is also preferable that the second material is used over ranges from between the pair of thin plate sections and the fixed sections to between the pair of thin plate sections and the movable sections. Accordingly, it is also possible to enhance the strength of portions of the pair of thin plate sections other than the joined portions.

It is also preferable that the second material is a metal. The ceramics have a high breaking strength against the compressive stress, but the breaking strength of the ceramics is low against the tensile stress. On the other hand, the metal has the high breaking strength against the tensile stress, but the breaking strength of the metal is low against the compressive stress. Therefore, when the two materials (ceramics and metal) are combined, it is possible to mutually supplement the drawbacks of both, and it is possible to secure high strength.

Further, when the metal is arranged on the surface, the metal causes elastic deformation in response to the tensile stress, and the metal absorbs the stress. Therefore, the fracture limitation is raised, and the breaking strength is increased as compared with a case in which the ceramics is exposed to the surface. In particular, it is possible to enhance the shock resistance.

It is also preferable that the second material is a cermet. It is preferable that the metal having a high elastic modulus is directly arranged on the ceramics. However, there is such a possibility that the metal may be exfoliated. Therefore, it is appropriate to use the cermet which has a high joining strength with respect to the ceramics.

It is preferable that the second material is a cermet composed of a constitutive material of the ceramic substrate and a metal. In this arrangement, when the ratio of the metal in the cermet is low, then the joining strength with respect to the ceramics is increased, but the property as the metal becomes poor. Therefore, it is preferable to select a condition in which the ratio of the metal is high and it is possible to secure the joining strength with respect to the ceramics.

It is also preferable that the piezoelectric/electrostrictive element is arranged on at least one thin plate section of the pair of thin plate sections.

According to still another aspect of the present invention, there is provided a method for producing a piezoelectric/electrostrictive device comprising a ceramic substrate and a piezoelectric/electrostrictive element formed on the ceramic substrate; the method including a step for manufacturing the ceramic substrate by sintering a molding after forming the molding by using raw materials containing a ceramic material; a step for forming the piezoelectric/electrostrictive element by a plurality of piezoelectric/electrostrictive layers and a plurality of electrode layers stacking alternately in a comb like structure on the ceramic substrate; wherein the step for forming the piezoelectric/electrostrictive element includes a step for forming one or more intermediate electrode layers at an intermediate portion of the piezoelectric/electrostrictive element by sintering a cermet film containing a conductive material and a piezoelectric/electrostrictive material to form the intermediate electrode layers.

Accordingly, it is possible to increase the driving force, it is possible to improve the yield, and it is possible to obtain the piezoelectric/electrostrictive device which is easily controllable. Further, it is possible to avoid the exfoliation of the piezoelectric/electrostrictive element formed on the ceramic substrate, it is possible to reduce the number of steps in relation to the production of the piezoelectric/electrostrictive device, and it is possible to improve the throughput. Additionally, it is possible to avoid the deterioration of the function as the piezoelectric/electrostrictive device.

In this procedure, it is also preferable that the step for forming said piezoelectric/electrostrictive element includes a step for filling one or more gaps of one or more lower electrode layers positioned at a lower portion of the piezoelectric/electrostrictive element with an insulating layer to form the lower electrode layers.

It is also preferable that after a first cermet to be converted into the lower electrode layers and a second cermet to be converted into the insulating layer are formed on the ceramic substrate by printing respectively, the first and second cermets formed on the ceramic substrate by printing are sintered.

According to still another aspect of the present invention, there is provided a method for producing a piezoelectric/electrostrictive device comprising a ceramic substrate including fixed sections which have a large thickness and a pair of thin plate sections which are formed continuously from the fixed sections and which has a thin thickness, and a piezoelectric/electrostrictive element formed on the ceramic substrate; the method including a step for forming a cermet paste by printing on opposing surfaces of a plurality of ceramic green sheets to be converted into the thin plate sections; a step for laminating the plurality of ceramic green sheets to form a ceramic green laminate; a step for sintering the ceramic green laminate to form a ceramic laminate; and a step for cutting off unnecessary portions after forming and sintering the piezoelectric/electrostrictive element on the ceramic laminate to manufacture the piezoelectric/electrostrictive device in which a second material is used between the pair of thin plate sections and the fixed sections.

Accordingly, it is possible to produce the piezoelectric/electrostrictive device which makes it possible to increase the breaking strength of the pair of thin plate sections and which makes it possible to improve the shock resistance. Thus, it is possible to realize the high reliability of the piezoelectric/electrostrictive device.

The above and other objects, features, and advantages of the present invention will become more apparent from the following description when taken in conjunction with the accompanying drawings in which a preferred embodiment of the present invention is shown by way of illustrative example.

DETAILED DESCRIPTION OF THE INVENTION

Embodiments of the piezoelectric/electrostrictive device according to the present invention and the method for producing the same will be described below with reference to FIGS. 1 to 24.

A piezoelectric/electrostrictive device 10 according to the present embodiment is a device or element which includes a concept that the electric energy and the mechanical energy are mutually convertible through a piezoelectric/electrostrictive element. Therefore, the piezoelectric/electrostrictive device 10 is preferably an active element such as a variety of actuators and vibrators, and is more preferably a displacement element for displacing on the basis of the inverse piezoelectric effect and the electrostrictive effect. The piezoelectric/electrostrictive device 10 is also preferably a passive element such as an acceleration sensor element and a shock sensor element.

Figure 1:
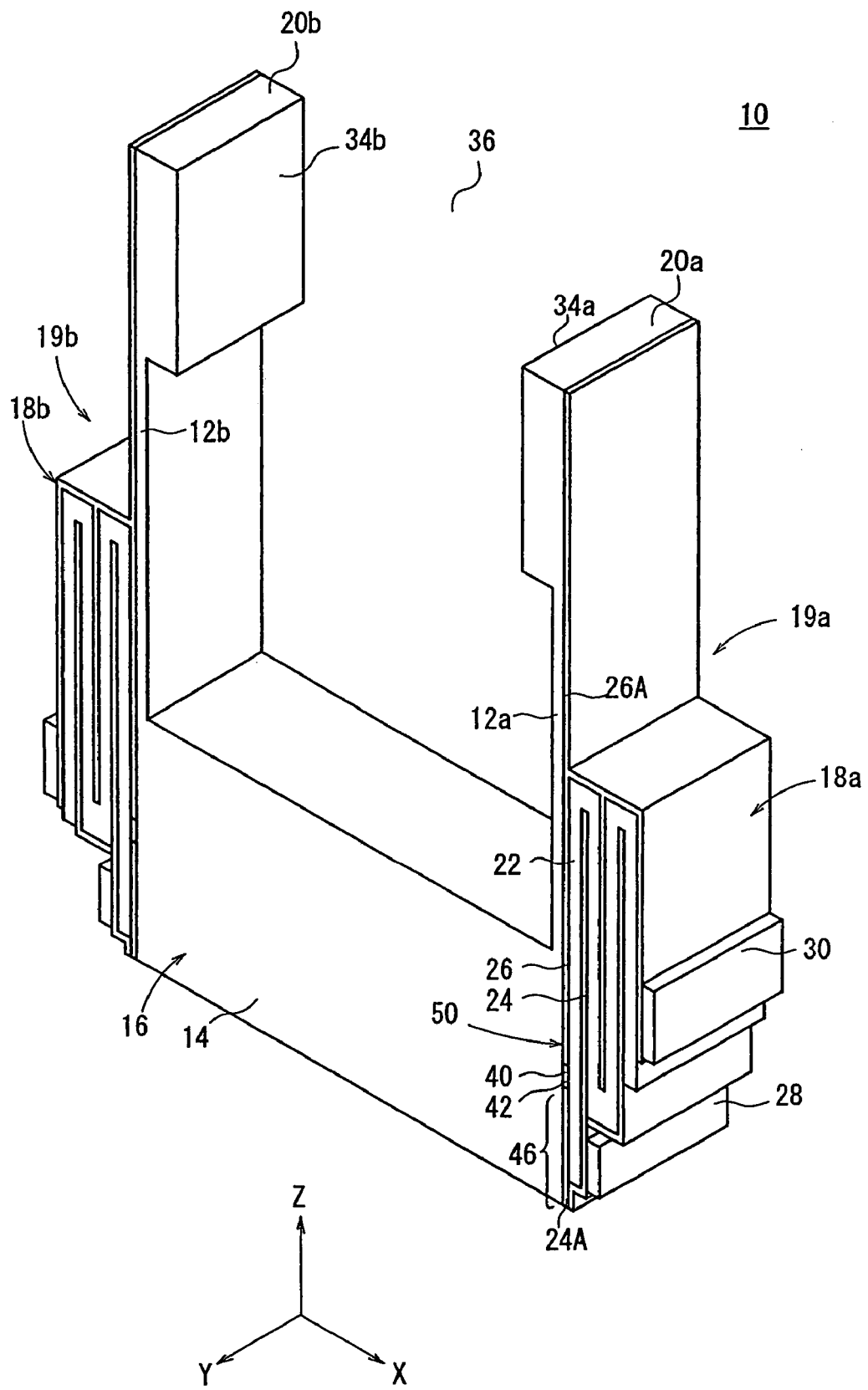
FIG. 1 is a perspective view illustrating an arrangement of a piezoelectric/electrostrictive device according to an embodiment of the present invention.

As shown in FIG. 1, the piezoelectric/electrostrictive device 10 according to the present embodiment comprises a ceramic substrate 16 which is formed with a pair of thin plate sections 12a, 12b which are opposite, and a fixed section 14 for supporting the thin plate sections 12a, 12b. The piezoelectric/electrostrictive device 10 includes piezoelectric/electrostrictive elements 18a, 18b which are formed on respective parts of the pair of thin plate sections 12a, 12b respectively.

That is, the piezoelectric/electrostrictive device 10 has a function such that the pair of thin plate sections 12a, 12b are displaced by driving the piezoelectric/electrostrictive elements 18a, 18b, or a function such that the displacement of the thin plate sections 12a, 12b is detected by the piezoelectric/electrostrictive elements 18a, 18b. Therefore, as shown in FIG. 1, actuator sections 19a, 19b are constructed by the thin plate sections 12a, 12b and the piezoelectric/electrostrictive elements 18a, 18b. Accordingly, the pair of thin plate sections 12a, 12b function as vibrating sections which can be vibrated while being supported by the fixed section 14.

Further, respective forward end portions of the pair of thin plate sections 12a, 12b are thick-walled portions which are thicker than other portions of the pair of thin plate sections 12a, 12b, and which are formed inwardly a gap (air) 36. The thick-walled portions function as movable sections which are displaceable in accordance with displacing the thin plate sections 12a, 12b. The thick-walled portions also function as attachment sections which hold an object that is interposed between the end portion of the pair of the thin plate sections 12a, 12b. The end portions of the pair of thin plate sections 12a, 12b are hereinafter referred to as "movable sections 20a, 20b".

The gap (air) 36 may be interposed between opposing end surfaces 34a, 34b of the movable sections 20a, 20b. A plurality of members (not shown) made of the same material as the constitutive material of the movable sections 20a, 20b or different materials from the constitutive material of the movable sections 20a, 20b may be interposed between the end surfaces 34a, 34b. In this arrangement, the opposing end surfaces 34a, 34b of the movable sections 20a, 20b also function as attachment surfaces 34a, 34b.

The ceramic substrate 16 is composed of a ceramic stack or laminate obtained, for example, by integrating a ceramic green stack or laminate into one unit by the sintering. This feature will be described later on.

The integrated ceramics as described above scarcely suffers from any secular change of the state, because no adhesive exists on joined portions of the respective parts. Therefore, the joined portions are highly reliable, and the structure is advantageous to secure the rigidity. Further, such an integrated ceramics can be produced with ease in accordance with the ceramic green sheet-laminating method as described later on.

After the ceramic substrate 16 and the piezoelectric/electrostrictive elements 18a, 18b are prepared separately as described later on, the piezoelectric/electrostrictive elements 18a, 18b are directly formed on the ceramic substrate 16 by using the film formation method for the ceramic substrate 16.

Each of the piezoelectric/electrostrictive elements 18a, 18b comprises a piezoelectric/electrostrictive layer 22 and a pair of electrodes 24, 26 formed on both sides of the piezoelectric/electrostrictive layer 22. The first electrode 26 of the pair of electrodes 24, 26 is formed at least on each of the pair of thin plate sections 12a, 12b.

In the embodiment of the present invention, the following case will be principally explained. That is, each of the piezoelectric/electrostrictive layer 22 and the pair of electrodes 24, 26 has a multilayered structure. The first electrode 24 and the second electrode 26 are alternately stacked respectively so that cross sections of the electrodes 24, 26 are comb-shaped cross sections. The first electrode 24 and the second electrode 26 are overlapped with each other with the piezoelectric/electrostrictive layer 22 intervening therebetween. As a result, each of the piezoelectric/electrostrictive elements 18a, 18b has a multiple stage structure. However, there is no limitation to the multilayered structure. A single layer structure may be used.

Figure 2:
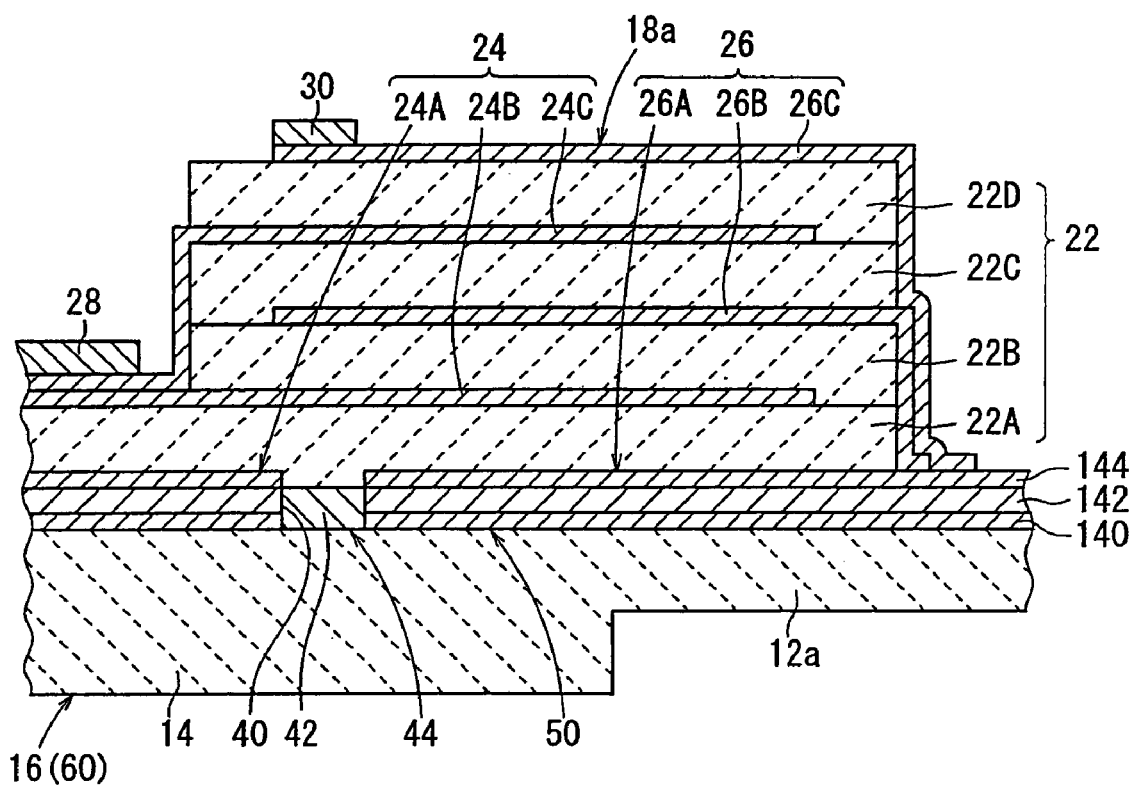
FIG. 2 is a magnified view illustrating a piezoelectric/electrostrictive element of the piezoelectric/electrostrictive device according to the embodiment of the present invention.

As shown in a magnified view in FIG. 2, each of the piezoelectric/electrostrictive elements 18a, 18b includes the piezoelectric/electrostrictive layer 22 which has a four-layered structure (first to fourth layers of piezoelectric/ electrostrictive layers 22A to 22D).

In particular, a first wiring pattern 50 is formed substantially over respective side surfaces of the thin plate section 12a, 12b, the movable section 20a, 20b, and the fixed section 14 of the ceramic substrate 16. The first wiring pattern 50 is separated into a first portion 24A (portion to constitute the first electrode 24) and a second portion 26A (portion to constitute the second electrode 26) on the side surface of the fixed section 14 by a gap 40.

The gap 40 is filled with an insulating layer 42 which functions as an insulating section 44 of the first wiring pattern 50.

The first electrode 24 is formed in a comb-shaped form which is comprised of the first portion 24A of the first wiring pattern 50, a second wiring pattern 24B formed on the upper surface of the first layer piezoelectric/electrostrictive layer 22A, and a fourth wiring pattern 24C formed on the upper surface of the third layer piezoelectric/electrostrictive layer 22C.

The second electrode 26 is formed in a comb-shaped form which is comprised of the second portion 26A of the first wiring pattern 50, a third wiring pattern 26B formed on the second layer piezoelectric/electrostrictive layer 22B, and a fifth wiring pattern 26C formed on the upper surface of the fourth layer piezoelectric/electrostrictive layer 22D.

A first terminal 28 is formed on the upper surface of a stack stacked by the first portion 24A of the first wiring pattern 50, the second wiring pattern 24B, and the fourth wiring pattern 24C. A second terminal 30 is formed at the end of the fifth wiring pattern 26C which is located on the uppermost layer.

The insulating section 44 has, for example, the following effects. That is, (1) the actuator is not driven at the backward end 46 of the piezoelectric/electrostrictive element 18a, 18b (portion ranging from the end of the gap 40 on the backward end side to the backward end of the fixed section 14), and (2) any short circuit is restrained at the edge of the first terminal 28.

As shown in FIG. 2, in the piezoelectric/electrostrictive device 10 according to this embodiment, the first wiring pattern 50 has a three-layered structure.

Specifically, the first wiring pattern 50 includes a first layer 140 which is formed directly on the ceramic substrate 16 and which is composed of a cermet of a substrate material and an electrode material, a second layer 142 which is formed on the first layer 140 and which is composed of an electrode material, and a third layer 144 which is formed on the second layer 142 and which is composed of a cermet of a piezoelectric/electrostrictive material and an electrode material.

Further, in this embodiment, the fifth wiring pattern 26C disposed at the uppermost layer of the second electrode 26 is composed of a resinate of an electrode material. Each of the wiring patterns (second to fourth wiring patterns 24B, 26B, 24C) of the respective electrode layers formed in the piezoelectric/electrostrictive element 18a, 18b is constructed by sintering a cermet film containing an electrode material and a piezoelectric/electrostrictive material. Further, each of the second to fourth wiring patterns 24B, 26B, 24C after the sintering is constituted such that the area of the conductive portion of each of the wiring patterns 24B, 26B, 24C occupies 80% or more of the area to be occupied by each of the wiring patterns 24B, 26B, 24C.

Figure 3A:
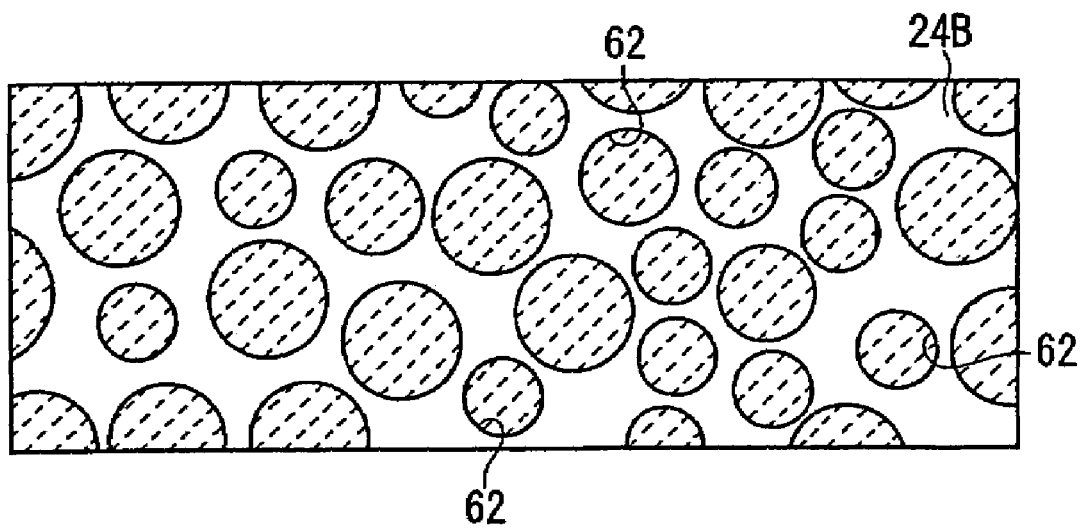
FIG. 3A is a view illustrating a state of a second wiring pattern after sintering the second wiring pattern formed by a metal film.

For example, it is assumed that the second wiring pattern 24B is composed of a metal film, and that the wiring pattern 24B is sintered only the piezoelectric/electrostrictive layer 22 or together with the piezoelectric/electrostrictive layer 22 to secure the wiring pattern 24B to the piezoelectric/electrostrictive layer 22. On this condition, as shown in FIG. 3A, a lot of unnecessary pores 62 and pores having large opening areas are generated in the second wiring pattern 24B by any partial evaporation or any thermal shrinkage of the second wiring pattern 24B during the sintering. As a result, the portion (conductive portion), which actually functions as the second wiring pattern 24B, is decreased. The diameters of the unnecessary pores 62 generated as described above are about 3 to 50 $\mu$m. Therefore, the unnecessary pores 62 are filled with the piezoelectric/electrostrictive material.

Figure 3B:
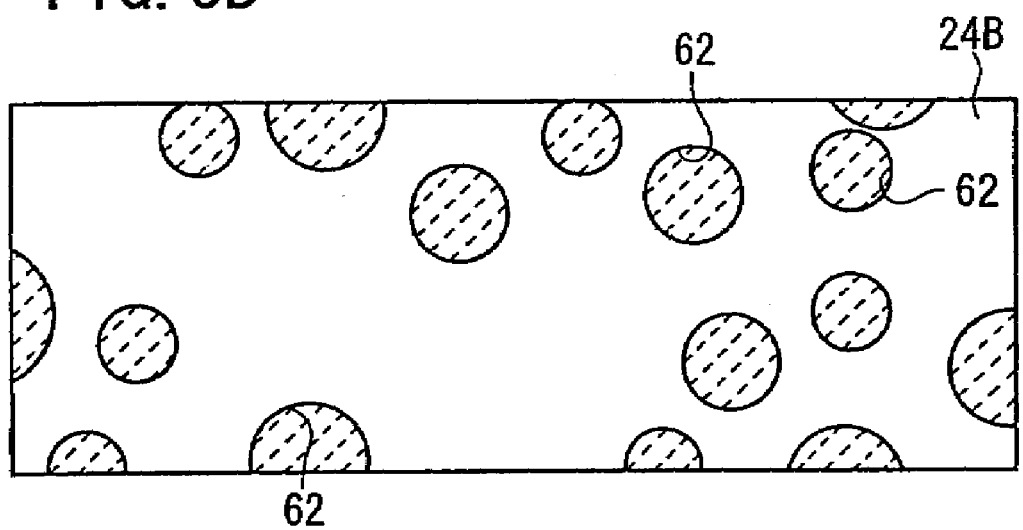
FIG. 3B is a view illustrating a state of a second wiring pattern after sintering the second wiring pattern formed by a cermet film.

However, in the present embodiment, as shown in FIG. 3B, the second wiring pattern 24B is formed by sintering the cermet film containing the conductive material and the piezoelectric/electrostrictive material. The area of the conductive portion in the second wiring pattern 24B after the sintering increases 80% or more to the area which would be occupied by the second wiring pattern 24B. Therefore, the area of the unnecessary pores 62 as described above is decreased. The aforementioned feature on the second wiring pattern 24B is also obtained in the third and fourth wiring patterns 26B, 24C.

Further, it is preferable that the volume ratio between the electrode material and the piezoelectric/electrostrictive material is 4:6 to 9:1 so that the second to fourth wiring patterns 24B, 26B, 24C function as the conductor layers. If the blending ratio of the electrode material of the volume ratio is smaller than 4, the wiring pattern 24B, 26B, 24C hardly functions as the conductor. On the other hand, if the blending ratio is larger than 9, both of the effect to thin the electrode and the adhesive force with respect to the piezoelectric/electrostrictive layer may be reduced. When the blending condition as described above satisfies the volume ratio, each of the intermediate patters can be constructed as the conductor layer being 4 $\mu$m or less in thickness. Further, the so-called breakage, in which the conductive portion locally disappears, is not caused. Thus, it is possible to obtain a pattern shape substantially exactly as designed.

When each of the second to fourth wiring patterns 24B, 26B, 24C is formed by sintering the cermet film containing the conductive material and the piezoelectric/electrostrictive material, the effect on the second to fourth wiring patterns 24B, 26B, 24C will be described. Firstly, a thin conductor layer is formed by performing the sintering after forming the cermet film.

That is, the piezoelectric/electrostrictive material components in the cermet film are moved to the piezoelectric/electrostrictive layers 22 during the sintering, and the remaining metal material forms the conductor layer. Therefore, the thin conductor layer, which is based on the metal, is formed at the portion interposed between the piezoelectric/electrostrictive layers 22. In this process, the portion which is not interposed between the piezoelectric/electrostrictive layers 22, for example, the portion on which the terminal 28 is formed as shown in FIG. 2 is formed as a cermet electrode layer in which the metal material and the piezoelectric/electrostrictive material are mixed with each other, i.e., a cermet electrode layer which is thicker than the conductor layer. However, even when the thickness of the cermet electrode layer is 4 μm or more, it is possible to increase the adhesive force with respect to the piezoelectric/electrostrictive layer 22 as compared with an electrode layer composed of a metal simple substance having the same thickness. Therefore, the exfoliation is hardly caused, and such a cermet electrode layer is advantageous to improve the reliability.

As described above, each of the second to fourth wiring patterns 24B, 26B, 24C described above is the electrode layer which is thin, includes the unnecessary pores 62 to a smaller extent, and which has the high adhesive force with respect to the piezoelectric/electrostrictive layer 22 as compared with the case in which the electrode layer is formed of a metal paste.

Next, a method for producing the piezoelectric/electrostrictive device 10 according to the present embodiment will be described with reference to FIGS. 4 to 11B. At first, the following terms are defined. A ceramic green laminate 58 is defined as a laminate which is obtained by laminating ceramic green sheets (see, for example, FIG. 5). A ceramic stack or laminate 60 is defined as a product which is obtained by sintering the ceramic green laminate 58 into one unit (see, for example, FIG. 6). A ceramic substrate 16 is defined as a product which is obtained by cutting off unnecessary portions from the ceramic stack or laminate 60 to integrally have the thin plate sections 12a, 12b and the fixed section 14 (see FIG. 1).

In this method, after a plurality of piezoelectric/electrostrictive devices 10 are arranged in a vertical direction and in a lateral direction respectively on an identical substrate, the ceramic laminate 60 is cut off per chip unit so that a number of piezoelectric/electrostrictive devices 10 are finally obtained in identical steps. However, in order to simplify the explanation, a method for producing one piezoelectric/electrostrictive device 10 will be described.

At first, a binder, a solvent, a dispersing agent, a plasticizer, and other components are added with a ceramic powder such as zirconia and these are mixed to prepare a slurry. Next, the slurry is subjected to a defoaming treatment to thereafter prepare ceramic green sheets having a predetermined thickness by the method such as the reverse roll coater method and the doctor blade method.

Figure 4:
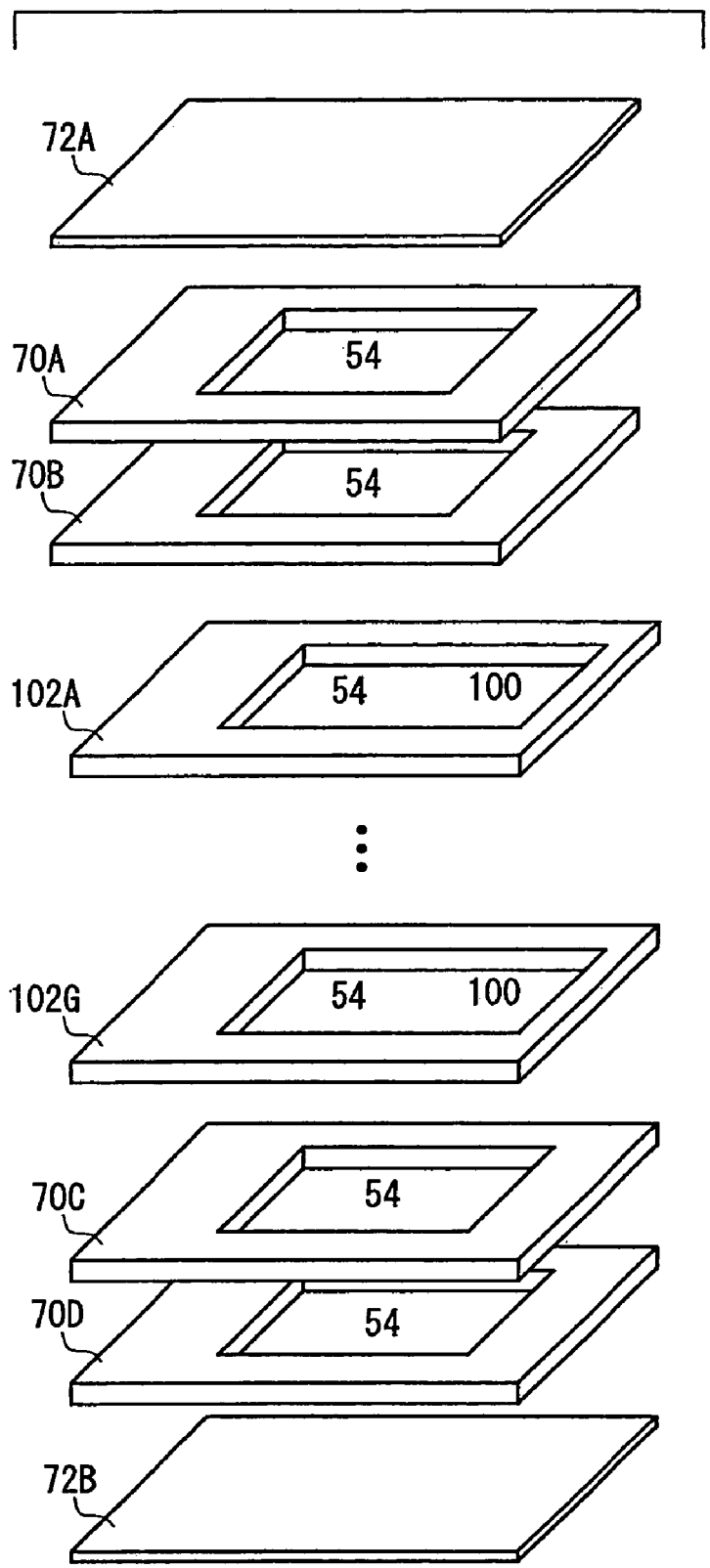
FIG. 4 is a view illustrating the process for laminating necessary ceramic green sheets.

Subsequently, the ceramic green sheets are machined a variety of shapes as shown in FIG. 4, for example, by the method such as the laser machining and the punching out based on the use of a die to obtain a plurality of ceramic green sheets 70A to 70D, 72A, 72B, 102A to 102G for forming the substrate.

The ceramic green sheets 70A to 70D are a plurality of (for example, two) ceramic green sheets provided with windows 100 for forming the movable sections 20a, 20b having the end surfaces 34a, 34b of the piezoelectric/electrostrictive device 10. On the other hand, the ceramic green sheets 102A to 102G are a plurality of (for example, four) sheets formed with windows 54 for forming the space at least between the thin plate sections 12a, 12b. The numbers of ceramic green sheets as described above are an example.

Figure 5:
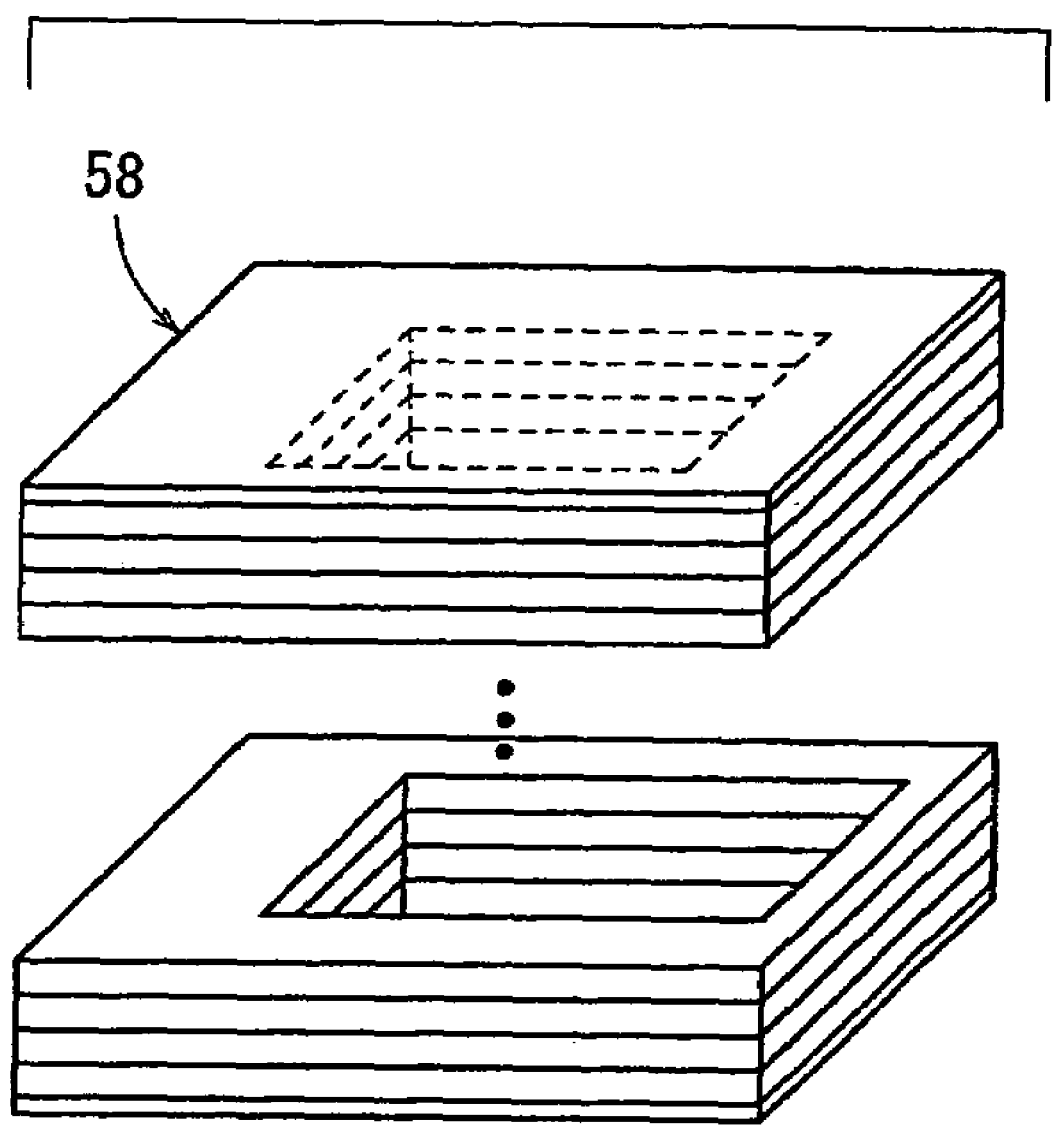
FIG. 5 is a view illustrating a ceramic green laminate laminated the ceramic green sheets.

Subsequently, as shown in FIG. 5, after the ceramic green sheets 70A to 70D, 72A, 72B, 102A to 102G are laminated so that the ceramic green sheets 70A to 70D, 102A to 102G are interposed between the ceramic green sheets 72A, 72B, the ceramic green laminate 58 is formed by securing the above-mentioned ceramic green sheet under pressure. When the lamination is performed, the ceramic green sheets are laminated while arranging the ceramic green sheets 102A to 102G at the center.

During this process, the pressure may not be applied to some portions of the ceramic green laminate 58 during the securing under the pressure, due to the presence of the windows 100. Therefore, it is necessary to change, for example, the order of the lamination and the securing under the pressure so that such portions do not appear. After that, the ceramic green laminate 58 is sintered to obtain the ceramic laminate 60 (see FIG. 6).

Figure 6:
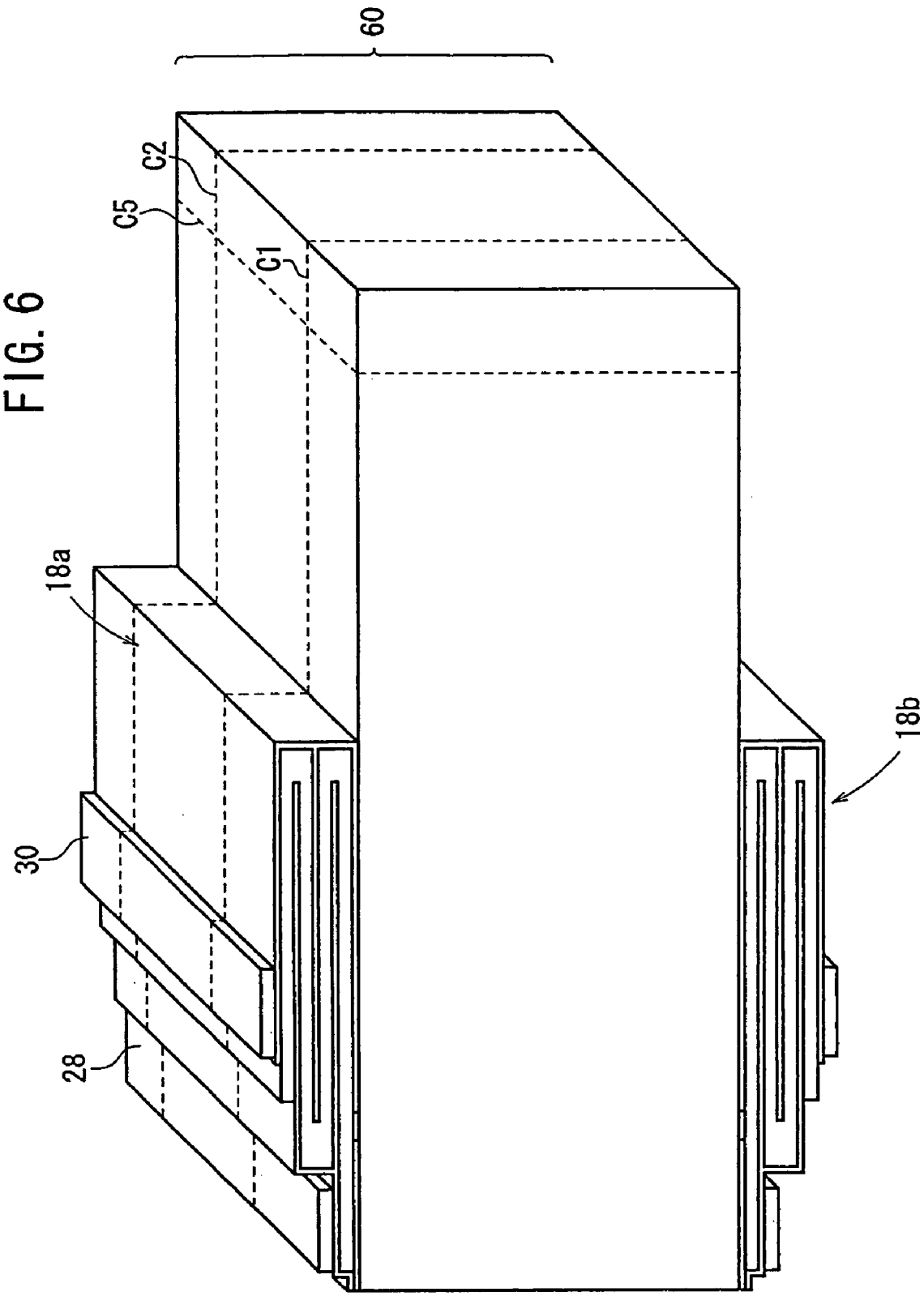
FIG. 6 is a view illustrating a ceramic laminate formed by sintering the ceramic green laminate and on which piezoelectric/electrostrictive elements are formed.

Subsequently, as shown in FIG. 6, the piezoelectric/electrostrictive elements 18a, 18b as the multilayered structure, are formed on the both surfaces of the ceramic laminate 60, i.e., on the surfaces laminated the ceramic green sheets 72A, 72B of the ceramic laminate 60. The piezoelectric/electrostrictive elements 18a, 18b and the ceramic laminate 60 are integrated into one unit by the sintering. Of course, the piezoelectric/electrostrictive element may be formed on only the surface on one side.

The process for forming the piezoelectric/electrostrictive element 18a having the multilayered structure on one surface of the ceramic laminate 60 will be described in detail with reference to FIGS. 7A to 11B. The process for forming the piezoelectric/electrostrictive element 18b is equivalent to the process for forming the piezoelectric/electrostrictive element 18a, any duplicate explanation of which will be herein omitted.

Figure 7A:
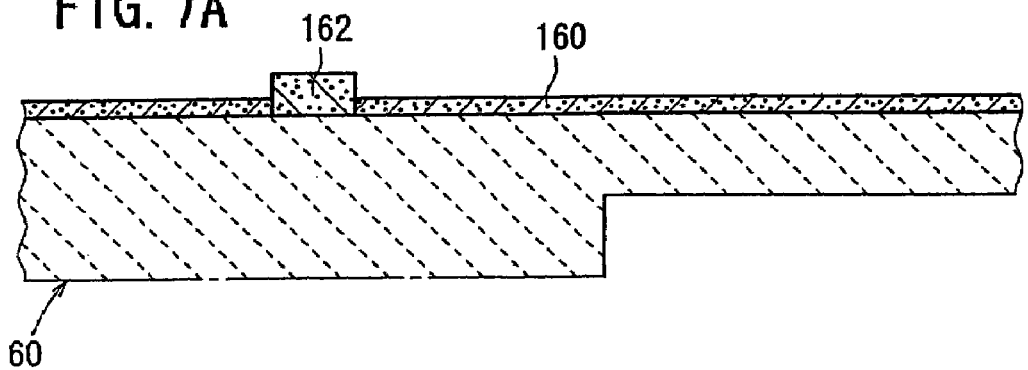
FIG. 7A is a view illustrating a stage at which a first cermet layer to be converted into a first layer of a first wiring pattern and a second cermet layer to be converted into an insulating layer are formed on a ceramic substrate.

At first, as shown in FIG. 7A, a first cermet layer 160, which is composed of, for example, Pt/zirconia, is formed on one surface of the ceramic laminate 60, for example, by the screen printing. After that, a second cermet layer 162, which is composed of, for example, Pt/zirconia, is formed on the portion (portion corresponding to the gap 40 shown in FIG. 2) at which the first cermet layer 160 is separated or divided, for example, by the screen printing. In this process, the respective thicknesses of the first cermet layer 160 and the second cermet layer 162 are set so that the thicknesses after the sintering are about 1 μm and about 5 μm respectively.

Figure 7B:
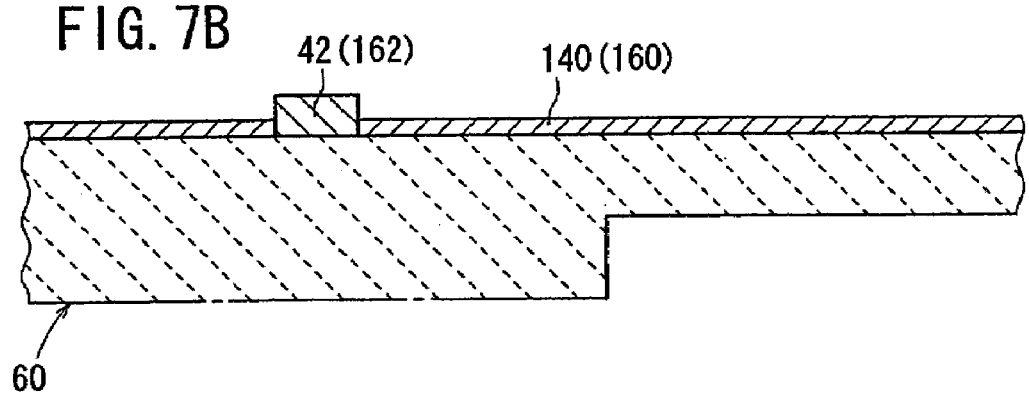
FIG. 7B is a view illustrating a stage at which the first layer and the insulating layer are simultaneously formed on the ceramic substrate.

After that, as shown in FIG. 7B, the first layer 140 (first layer for constituting the first wiring pattern 50) based on the first cermet layer 160 and the insulating layer 42 based on the second cermet layer 162 are formed on the surface of the ceramic laminate 60 by a sintering treatment which maintains the first cermet layer 160 and the second cermet layer 162 at a temperature of 1000 to 1400° C. for about 0.5 to 3 hours.

Figure 7C:
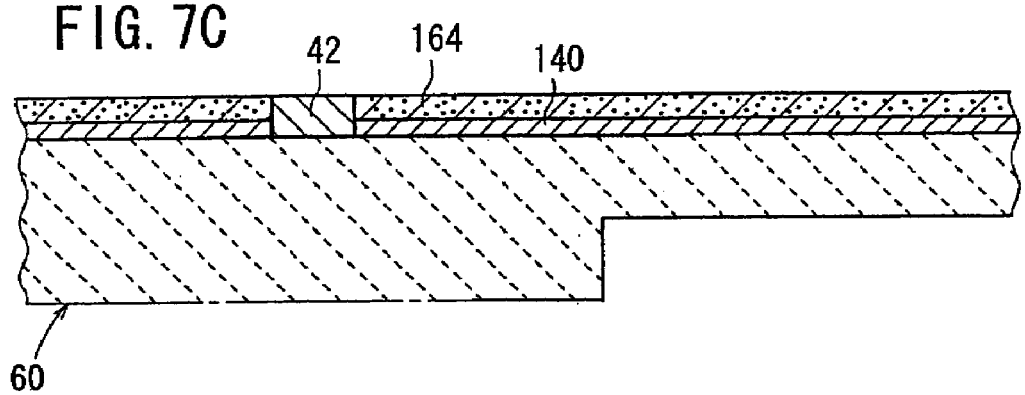
FIG. 7C is a view illustrating a stage at which a Pt paste to be converted into a second layer of the first wiring pattern is formed on the first layer of the first wiring pattern.

After that, as shown in FIG. 7C, for example, a Pt paste 164 is formed on the first layer 140, for example, by the screen printing. In this process, the thickness of the Pt paste 164 is set so that the thickness after the sintering is 2 to 5 μm.

Figure 8A:
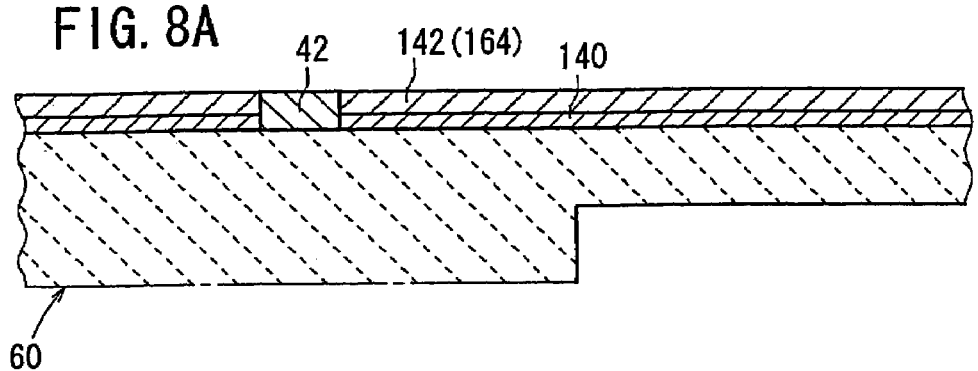
FIG. 8A is a view illustrating a stage at which the second layer is formed on the first layer of the first wiring pattern.

After that, as shown in FIG. 8A, the second layer 142 (second layer for constituting the first wiring pattern 50) based on the Pt paste 164 is formed on the first layer 140 by a sintering treatment which maintains the Pt paste 164 at a temperature of 1000 to 1400° C. for about 0.5 to 3 hours.

Figure 8B:
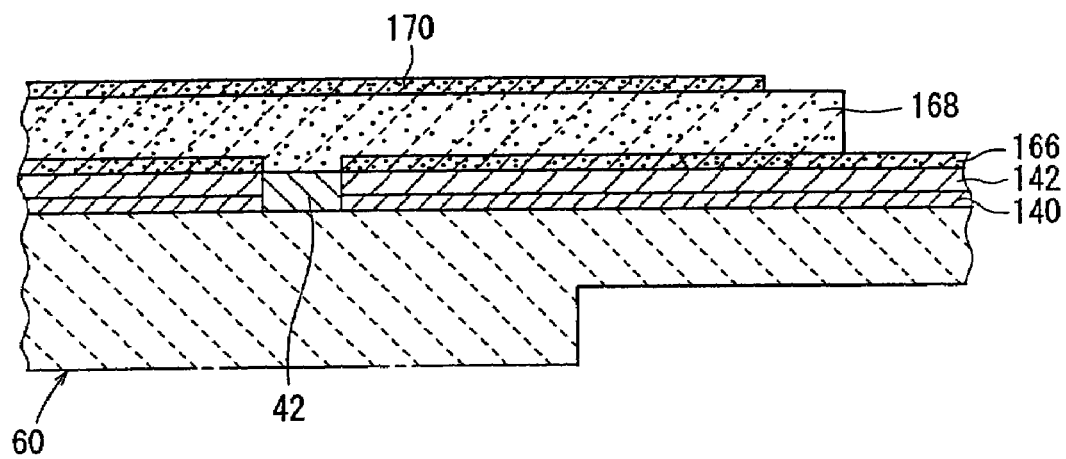
FIG. 8B is a view illustrating a stage at which a layer to be converted into a third layer of the first wiring pattern, a PZT paste to be converted into a first layer piezoelectric/electrostrictive layer, and a fourth cermet layer to be converted into a second wiring pattern are formed.

After that, as shown in FIG. 8B, a third cermet layer 166, which is composed of, for example, Pt/PZT, is formed on the second layer 142, for example, by the screen printing. In this process, the thickness of the third cermet layer 166 is set so that the thickness after the sintering is 0.5 to 5 μm.

Subsequently, for example, a first layer PZT paste 168 is formed on the third cermet layer 166 and on the exposed insulating layer 42, for example, by the screen printing. In this process, the thickness of the PZT paste 168 is set so that the thickness after the sintering is 5 to 25 μm.

Subsequently, for example, a fourth cermet layer 170 of Pt/PZT, which is to be converted into the second wiring pattern 24B thereafter, is formed on the PZT paste 168 and on a first portion 166a (portion corresponding to the first portion 24A of the first wiring pattern 50 thereafter) of the exposed third cermet layer 166, for example, by the screen printing. In this process, the thickness of the fourth cermet layer 170 is set so that the thickness after the sintering is 1 to 3 µm.

Figure 8C:
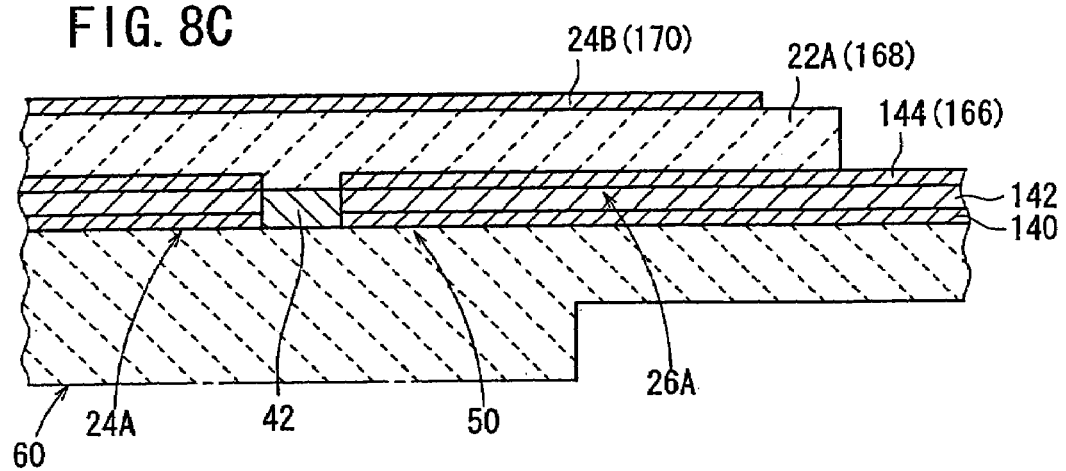
FIG. 8C is a view illustrating a stage at which the third layer, the first layer piezoelectric/electrostrictive layer, and the second wiring pattern are simultaneously formed.

After that, as shown in FIG. 8C, the third layer 144 (third layer for constituting the first wiring pattern 50) based on the third cermet layer 166, the first layer piezoelectric/electrostrictive layer 22A based on the PZT paste 168, and the second wiring pattern 24B based on the fourth cermet layer 170 are formed by a sintering treatment which maintain the third cermet layer 166, the PZT paste 168 and the fourth cermet layer 170 at a temperature of 1000 to 1400° C. for about 0.5 to 3 hours.

In this procedure, the second wiring pattern 24B is composed of the fourth cermet layer 170 of Pt/PZT. Therefore, the thermal shrinkage and the partial evaporation are scarcely caused upon the sintering to be performed thereafter. For example, as shown in FIG. 3B, the generation of unnecessary pores 62 is greatly suppressed. Further, the second wiring pattern 24B is constituted as the conductor layer having its film of 4 µm or less in thickness.

Figure 9A:
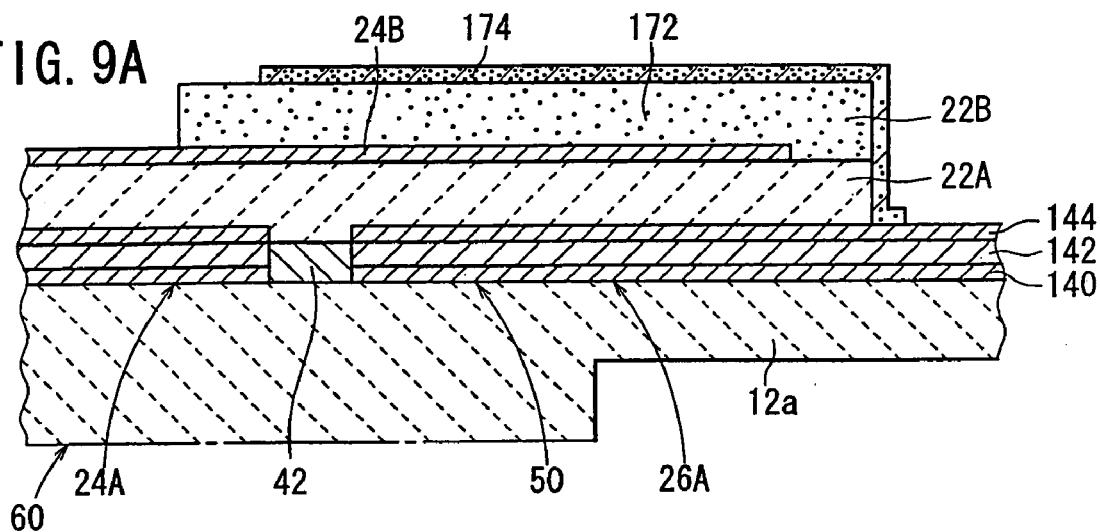
FIG. 9A is a view illustrating a stage at which a PZT paste to be converted into a second layer piezoelectric/electrostrictive layer and a fifth cermet layer to be converted into a third wiring pattern are formed.

After that, as shown in FIG. 9A, for example, a second layer PZT paste 172 is formed on the second wiring pattern 24B and on the exposed first layer piezoelectric/electrostrictive layer 22A, for example, by the screen printing. In this process, the thickness of the PZT paste 172 is set so that the thickness after the sintering is 5 to 25 µm.

Subsequently, a fifth cermet layer 174, which is composed of, for example, Pt/PZT and which is to be converted into the third wiring pattern 26B, is formed on the PZT paste 172 and on the second portion 26A of the first wiring pattern 50, for example, by the screen printing. In this process, the thickness of the fifth cermet layer 174 is set so that the thickness after the sintering is 1 to 3 µm.

Figure 9B:
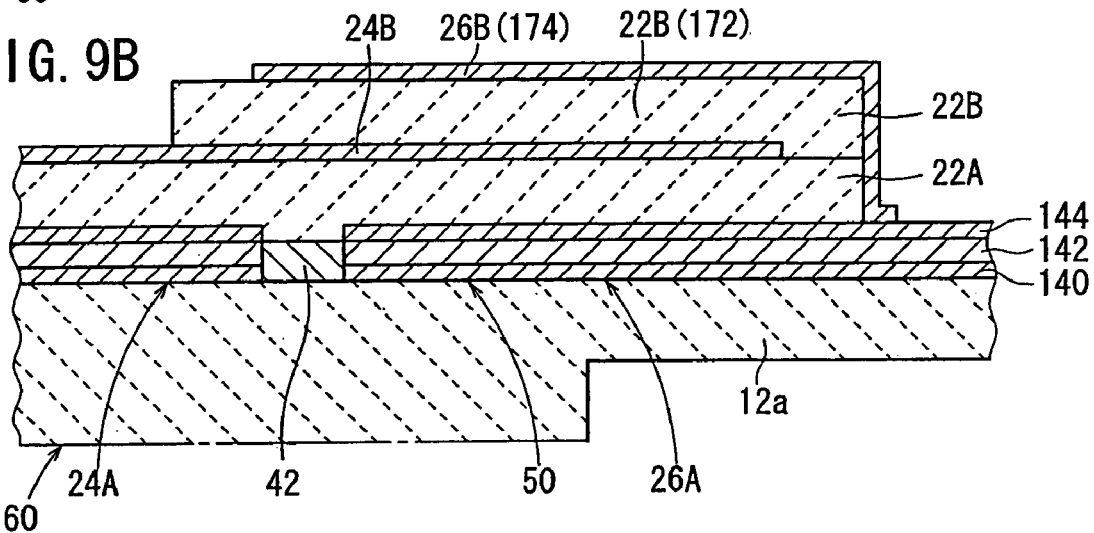
FIG. 9B is a view illustrating a stage at which the second layer piezoelectric/electrostrictive layer and the third wiring pattern are simultaneously formed.

After that, as shown in FIG. 9B, the second layer piezoelectric/electrostrictive layer 22B based on the PZT paste 172 and the third wiring pattern 26B based on the fifth cermet layer 174 are formed by a sintering treatment which maintains the PZT paste 172 and the fifth cermet layer 174 at a temperature of 1000 to 1400° C. for about 0.5 to 3 hours. Also in this procedure, the third wiring pattern 26B is composed of the fifth cermet layer 174 of Pt/PZT. Therefore, the generation of unnecessary pores 62 is greatly suppressed even upon the sintering to be performed thereafter. Further, the third wiring pattern 26B is constituted as the conductor layer having its film of 4 µm or less in thickness.

Figure 9C:
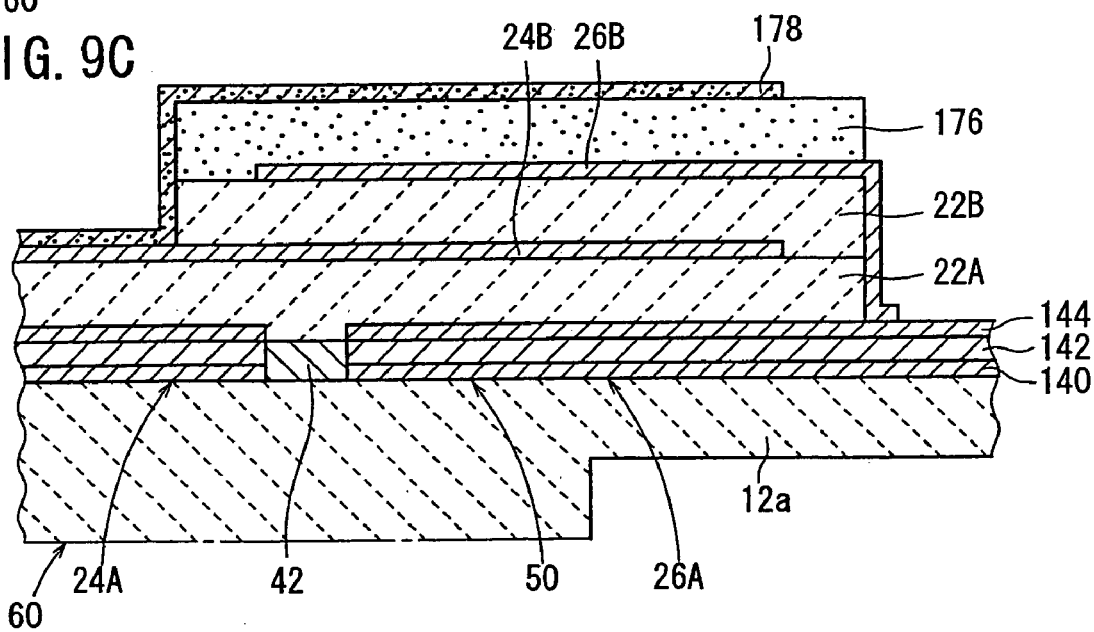
FIG. 9C is a view illustrating a stage at which a PZT paste to be converted into a third layer piezoelectric/electrostrictive layer and a sixth cermet layer to be converted into a fourth wiring pattern are formed.

After that, as shown in FIG. 9C, for example, a third layer PZT paste 176 is formed on the third wiring pattern 26B and the exposed second layer piezoelectric/electrostrictive layer 22B, for example, by the screen printing. In this process, the thickness of the PZT paste 176 is set so that the thickness after the sintering is 5 to 25 µm.

Subsequently, a sixth cermet layer 178, which is composed of, for example, Pt/PZT and which is to be converted into the fourth wiring pattern 24C, is formed on the PZT paste 176 and on the exposed second wiring pattern 24B, for example, by the screen printing. In this process, the thickness of the sixth cermet layer 178 is set so that the thickness after the sintering is 1 to 3 µm.

Figure 10A:
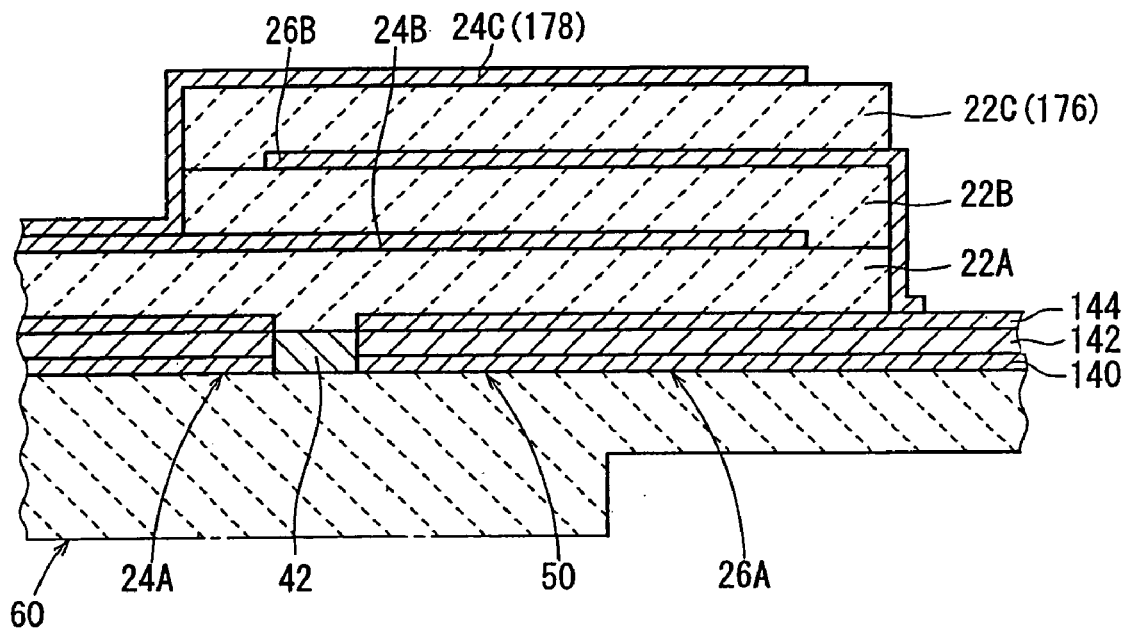
FIG. 10A is a view illustrating a stage at which the third layer piezoelectric/electrostrictive layer and the fourth wiring pattern are simultaneously formed.

After that, as shown in FIG. 10A, the third layer piezoelectric/electrostrictive layer 22C based on the PZT paste 176 and the fourth wiring pattern 24C based on the sixth cermet layer 178 are formed by a sintering treatment which maintains the PZT paste 176 and the sixth cermet layer 178 at a temperature of 1000 to 1400° C. for about 0.5 to 3 hours. Also in this procedure, the fourth wiring pattern 24C is composed of the sixth cermet layer 178 of Pt/PZT. Therefore, the generation of unnecessary pores 62 is greatly suppressed even upon the sintering to be performed thereafter. Further, the fourth wiring pattern 24C is constituted as the conductor layer having its film of 4 µm or less in thickness.

Figure 10B:
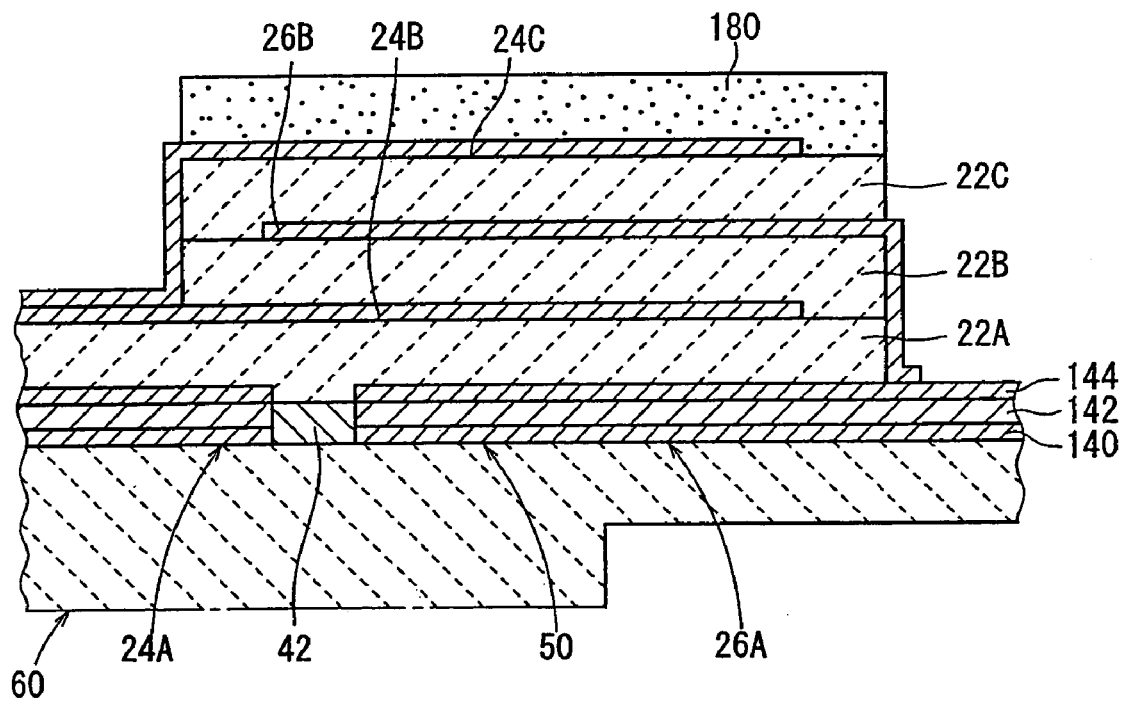
FIG. 10B is a view illustrating a stage at which a PZT paste to be converted into fourth layer piezoelectric/electrostrictive layer is formed.

After that, as shown in FIG. 10B, for example, a fourth layer PZT paste 180 is formed on the fourth wiring pattern 24C and on the exposed third layer piezoelectric/electrostrictive layer 22C, for example, by the screen printing. In this process, the thickness of the PZT paste 180 is set so that the thickness after the sintering is 5 to 25 µm.

Figure 11A:
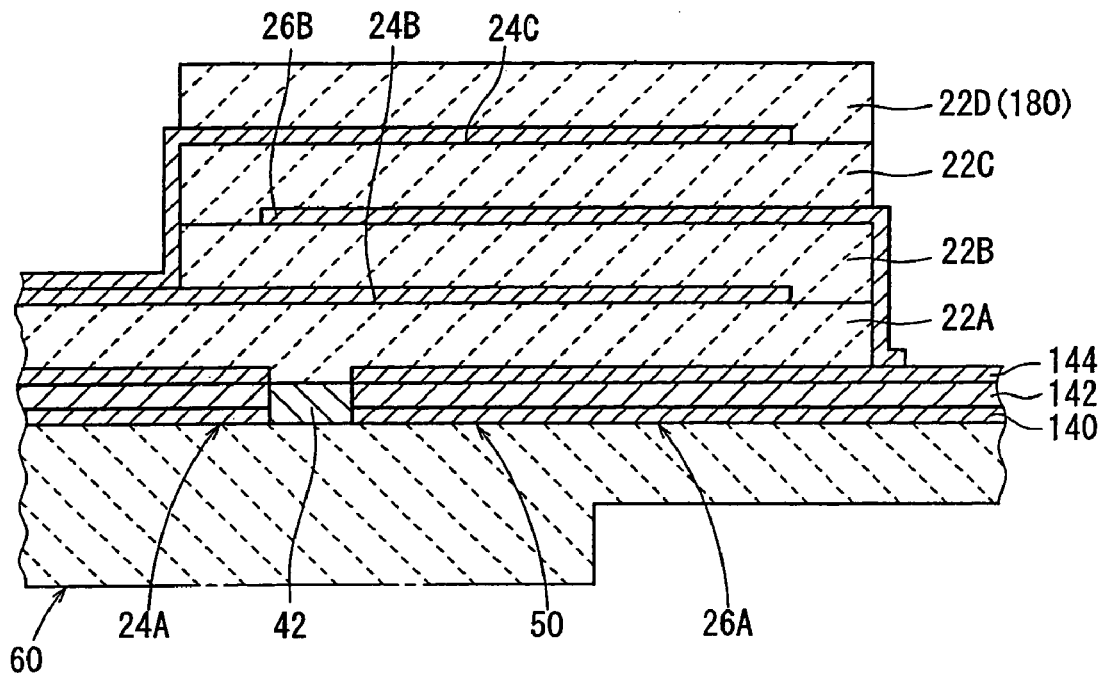
FIG. 11A is a view illustrating a stage at which the fourth layer piezoelectric/electrostrictive layer is formed.

After that, as shown in FIG. 11A, the fourth layer piezoelectric/electrostrictive layer 22D based on the PZT paste 180 is formed on the third layer piezoelectric/electrostrictive layer 22C and the fourth wiring pattern 24C by a sintering treatment which maintains the PZT paste 180 at a temperature of 1000 to 1400° C. for about 0.5 to 3 hours.

Figure 11B:
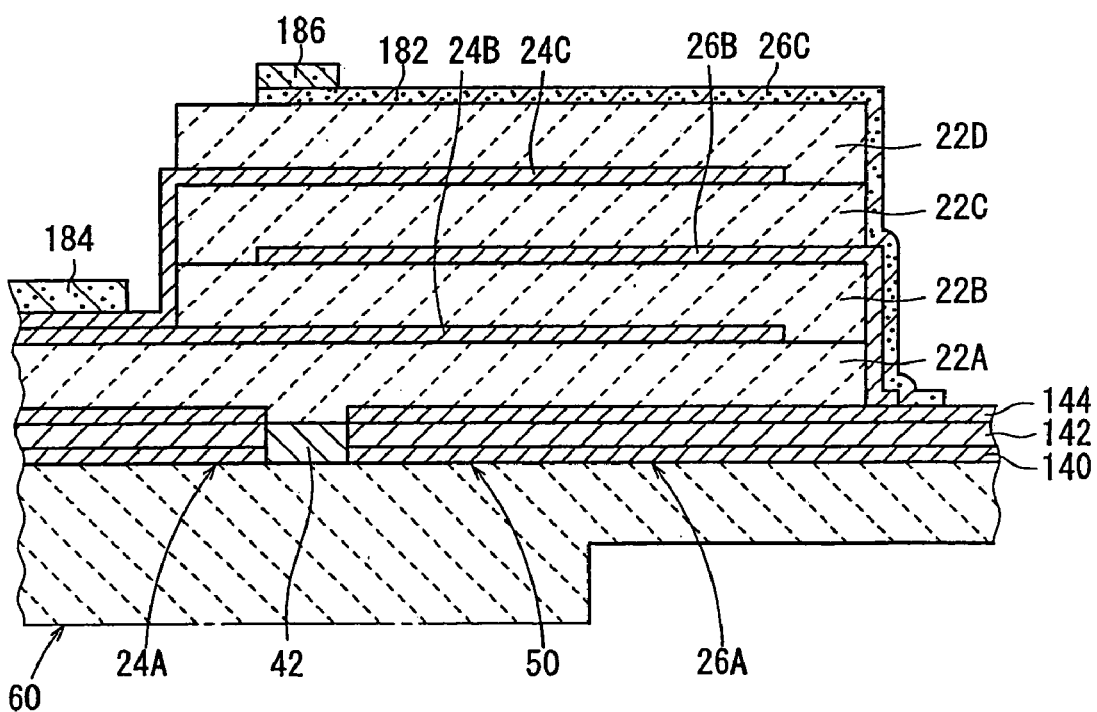
FIG. 11B is a view illustrating a stage at which a Pt resinate to be converted into a fifth wiring pattern and Au pastes to be converted into terminals are formed.

After that, as shown in FIG. 11B, for example, a Pt resinate 182, which is to be converted into the fifth wiring pattern 26C thereafter, is formed on the fourth layer piezoelectric/electrostrictive layer 22D, on the exposed third wiring pattern 26B, and on the exposed second portion 26A of the first wiring pattern 50, for example, by the screen printing. In this process, the thickness of the Pt resinate 182 is set so that the thickness after the sintering is 0.1 to 3 µm.

Subsequently, Au pastes 184, 186, which are to be converted into the first terminal 28 and the second terminal 30 thereafter respectively, are formed on the exposed first portion 24A of the first wiring pattern 50 and on the end of the Pt resinate 182, for example, by the screen printing.

After that, the fifth wiring pattern 26C based on the Pt resinate 182 and the terminals 28, 30 based on the Au pastes 184, 186 are formed by a sintering treatment which maintains the Pt resinate 182 and the terminals 28, 30 at a temperature of 500 to 1000° C. for about 0.5 to 3 hours. Accordingly, as shown in FIG. 2, the piezoelectric/electrostrictive element 18a having the multilayered structure is formed on one surface of the ceramic laminate 60. The piezoelectric/electrostrictive element 18b having the multilayered structure is also formed on the other surface of the ceramic laminate 60 by the same or equivalent method.

After that, as shown in FIG. 6, side portions and a forward end portion of the ceramic laminate 60 are cut off by cutting the ceramic laminate 60 formed with the piezoelectric/electrostrictive elements 18a, 18b along cutting lines C1, C2, C5. As a result of the cutoff, as shown in FIG. 1, the piezoelectric/electrostrictive device 10, in which the piezoelectric/electrostrictive elements 18a, 18b are formed on the ceramic substrate 16, is obtained, and the movable sections 20a, 20b having the opposing end surfaces 34a, 34b are formed respectively.

Several orders or timings of cutting are applicable. That is, the cutting may be performed along the cutting line C5 after performing the cutting along the cutting lines C1, C2. Alternatively, the cutting may be performed along the cutting lines C1, C2 after performing the cutting along the cutting line C5. Of course, these cutting operations may be performed simultaneously. The end surface of the fixed section 14 opposed to the cutting line C5 may be appropriately cut.

After that, scraps or the like resulting from the cutting are removed, for example, by the ultrasonic cleaning.

As described above, in the piezoelectric/electrostrictive device 10 according to the embodiment, the second to fourth wiring patterns 24B, 26B, 24C, which are disposed at the intermediate portions in the stacking direction, are formed by sintering the cermet films each of which contains the conductive material and the piezoelectric/electrostrictive material. Therefore, it is possible to increase the occupied area occupied by the conductive portion of each of the electrode layers. Accordingly, the capacitance is increased, the driving force is increased, and thus the displacement amount is increased as well.

Further, the unnecessary pores 62 are hardly generated in the embodiment of the present invention as compared with the case in which the unnecessary pores 62 are irregularly generated. Therefore, the dispersion of the area of the conductive portion of one electrode layer of the individual device is also decreased. Accordingly, the dispersion of capacitances among the individual devices is decreased. It is unnecessary that the control voltage is adjusted for every device one by one when the device is used. Thus, the device is conveniently usable (easily controllable).

Similarly, the dispersion of displacement characteristics of the individual devices is also decreased. Thus, it is possible to improve the accuracy in relation to the displacement amount.

Further, in the second to fourth wiring patterns 24B, 26B, 24C described above, the thickness of each of the conductor layers can be thinned to be 4 μm. Therefore, it is possible to effectively decrease the volume of the piezoelectric/electrostrictive element 18a, 18b itself as well. Accordingly, it is possible to decrease the resistance on the displacement action, and it is possible to further increase the driving force (increase the displacement amount) in cooperation with the increase in capacitance.

Further, the first wiring pattern 50 is strongly bonded to the ceramic substrate 16 and the first layer piezoelectric/electrostrictive layer 22A by the film formation method. Further, owing to the insulating layer 42 charged into the gap 40 of the first wiring pattern 50, any part of the first layer piezoelectric/electrostrictive layer 22A is never arranged on the gap 40. Accordingly, it is possible to reliably avoid the exfoliation of the piezoelectric/electrostrictive layer 22A during the machining and during the washing.

As a result, the cutting step for the ceramic laminate 60 is not restricted by any condition in which the machining load is small. Therefore, the machining time is shortened, and it is possible to improve the throughput.

It is also unnecessary that the washing step is performed under a condition in which the load on the piezoelectric/electrostrictive layer 22A or the like is decreased. Thus, it is possible to efficiently shorten the washing time, and it is possible to realize the reduction of the number of steps.

In the embodiment illustrated in FIGS. 7A to 7C described above, the second cermet layer 162, which has the thickness larger than that of the first cermet layer, is formed at the portion at which the first cermet layer 160 is separated, the heat treatment is thereafter applied so that the first cermet layer 160 is converted into the first layer 140 and the second cermet layer 162 is converted into the insulating layer 42, and then the Pt paste 164 is formed on the first layer 140. Alternatively, the production may be performed as shown in FIGS. 12A to 12C.

Figure 12A:
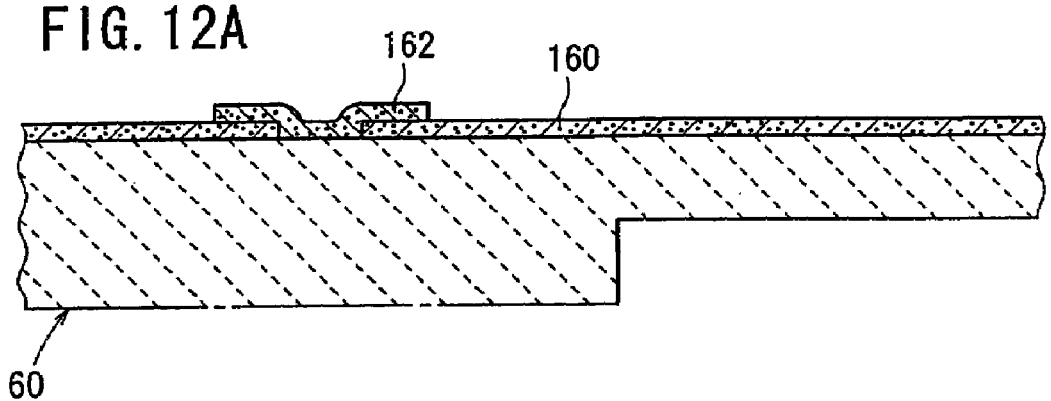
FIG. 12A is a view illustrating another embodiment corresponding to the production process for the piezoelectric/electrostrictive device according to the present invention shown in FIG. 7A.

That is, as shown in FIG. 12A, a second cermet layer 162, which has substantially the same thickness as the thickness of the first cermet layer 160 and which has a width larger than the width of the portion at which the first cermet layer 160 is separated, is formed at the portion at which the first cermet layer 160 is separated.

Figure 12B:
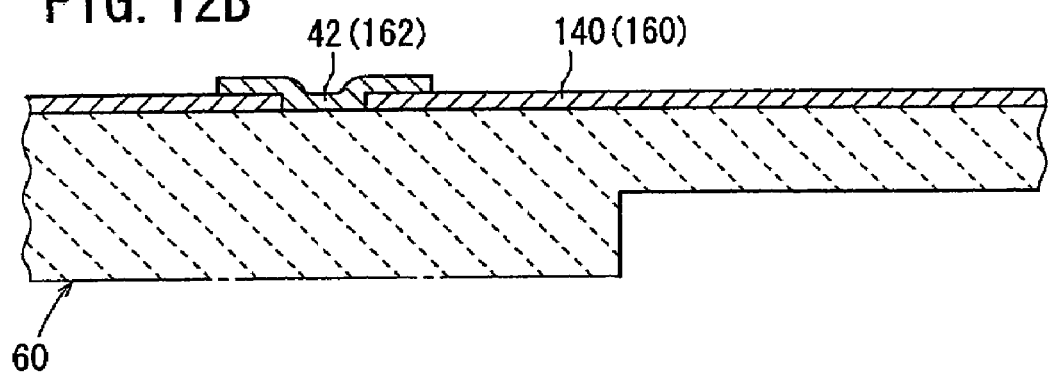
FIG. 12B is a view illustrating another embodiment corresponding to the production process for the piezoelectric/electrostrictive device according to the present invention shown in FIG. 7B.

After that, as shown in FIG. 12B, the first layer 140 based on the first cermet layer 160 and form an insulating layer 42 based on the second cermet layer 162 is formed by a sintering treatment which maintains the first cermet layer 160 and the second cermet layer 162 at a temperature of 1000 to 1400° C. for about 0.5 to 3 hours.

Figure 12C:
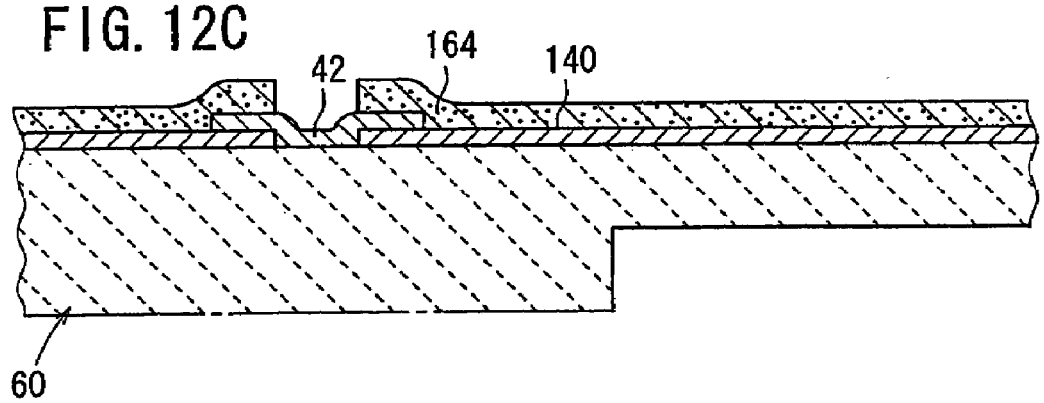
FIG. 12C is a view illustrating another embodiment corresponding to the production process for the piezoelectric/electrostrictive device according to the present invention shown in FIG. 7C.

After that, as shown in FIG. 12C, for example, a Pt paste 164 is formed on the first layer 140, for example, by the screen printing. In this process, the Pt paste 164 is formed so that the shoulders of the insulating layer 42 are coated with the Pt paste 164 and the central portion of the insulating layer 42 is exposed.

Figure 13:
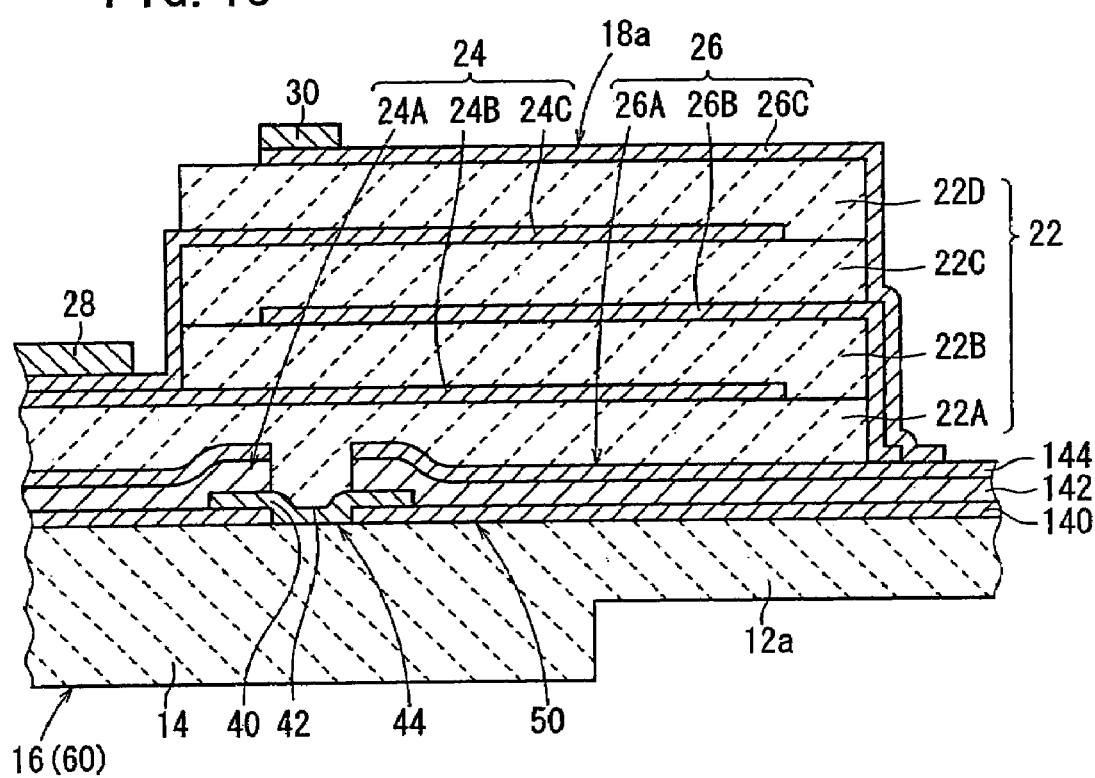
FIG. 13 is a view illustrating an embodiment in which an insulating layer composed of a thin film is interposed between a first portion and a second portion of the first wiring pattern of the piezoelectric/electrostrictive device according to the embodiment of the present invention.

After that, the same steps as the steps shown in FIGS. 8A to 11B are executed, and thus a form is obtained as shown in FIG. 13, in which the insulating layer 42 is interposed between the first portion 24A and the second portion 26A of the first wiring pattern 50. Therefore, it is possible to reliably avoid the exfoliation of the piezoelectric/electrostrictive layer 22A during the machining and during the washing.

In particular, the insulating layer 42 shown in FIG. 13 is a thin film unlike the insulating layer 42 shown in FIG. 2. Therefore, the piezoelectric/electrostrictive layer 22A, which is formed as the upper layer, enters the space between the first portion 24A and the second portion 26A of the first wiring pattern 50, and the adhesion performance of the piezoelectric/electrostrictive layer 22A is improved owing to the so-called anchor effect.

Further, in this form, both sides of the insulating layer 42 are firmly held by the second layer 142 and the third layer 144. Therefore, these components function similarly to the so-called eyelet. It is possible to improve the adhesion performance of the insulating layer 42 and the first wiring pattern 50 with respect to the ceramic laminate 60.

Further, this production method can be carried out while mitigating the accuracy of the mask alignment or adjustment as compared with the production method shown in FIGS. 7A to 7C. Therefore, it is possible effectively simplify the production steps, and it is possible to effectively reduce the number of steps.

Figure 14:
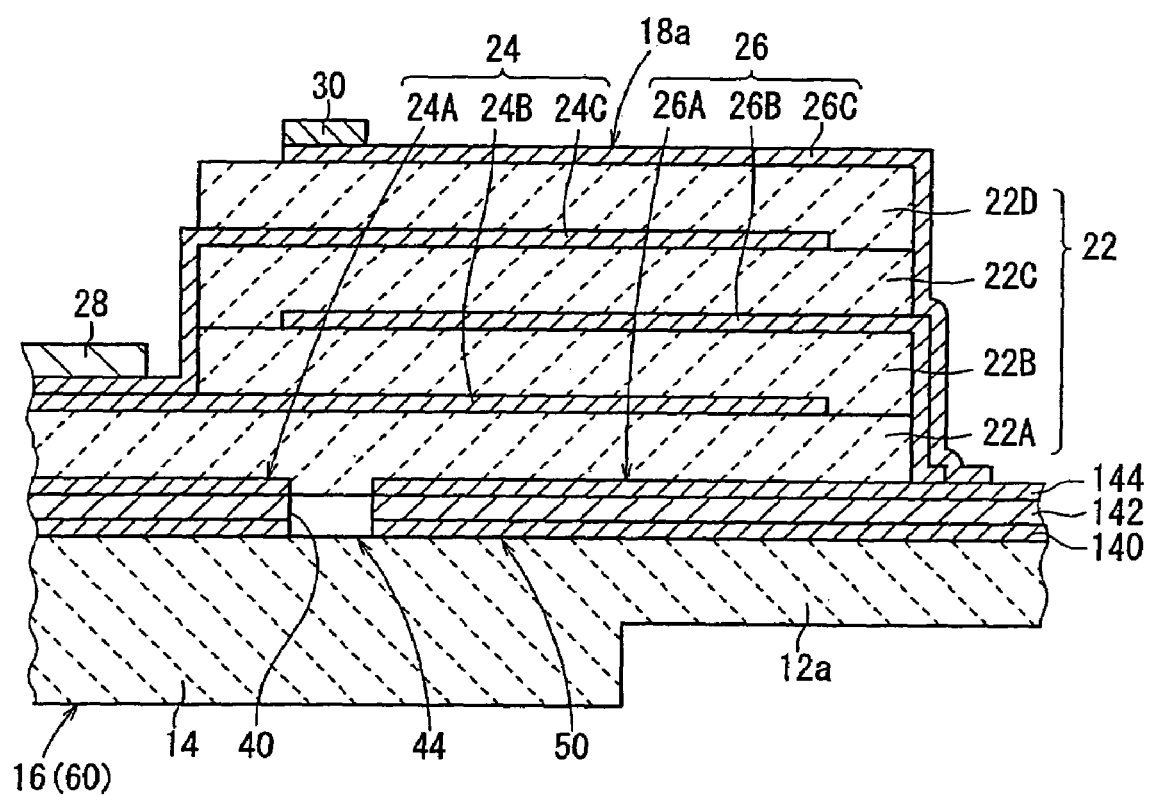
FIG. 14 is a magnified view illustrating the portion of the piezoelectric/electrostrictive device according to the embodiment of the present invention on which the piezoelectric/electrostrictive element is formed, depicting that the gap is present between the electrode layers.

As shown in FIG. 14, it is also allowable that the gap 40 may be provided as it is without changing the insulating layer 42 in the steps described above.

Next, the respective constitutive elements of the piezoelectric/electrostrictive device 10 according to the present embodiment will be explained.

The movable sections 20a, 20b are the parts which are operated on the basis of the driving amounts of the thin plate sections 12a, 12b as described above. A variety of members are attached thereto depending on the purpose of use of the piezoelectric/electrostrictive device 10. For example, when the piezoelectric/electrostrictive device 10 is used as a displacement element, a shield plate for an optical shutter or the like is attached. In particular, when the piezoelectric/electrostrictive device 10 is used for the positioning of a magnetic head of a hard disk drive or for a ringing-suppressing mechanism, a member required to be positioned, including, for example, a magnetic head, a slider provided with a magnetic head, and a suspension provided with a slider is attached.

The fixed section 14 is the part which supports the thin plate sections 12a, 12b and the movable sections 20a, 20b as described above. For example, when the piezoelectric/electrostrictive device 10 is utilized to position a magnetic head of a hard disk drive as described above, the fixed section 14 is supported by and secured to, for example, a carriage arm attached to VCM (voice coil motor) or a suspension or a fixed plate attached to the carriage arm. Accordingly, the entire piezoelectric/electrostrictive device 10 is fixed. Further, as shown in FIG. 1, the terminals 28, 30 and other members for driving the piezoelectric/electrostrictive elements 18a, 18b are arranged on the fixed section 14 in some cases.

The materials for constituting the movable sections 20a, 20b and the fixed section 14 are not specifically limited as long as the materials have certain rigidity. However, the ceramics, to which the ceramic green sheet-laminating method is applicable as described above, can be preferably used.

Specifically, there may be exemplified materials containing a major component of zirconia represented by fully stabilized zirconia and partially stabilized zirconia, alumina, magnesia, silicon nitride, aluminum nitride, and titanium oxide. Further, there may be exemplified materials containing a major component of a mixture thereof. However, it is preferable to use a material containing a major component of zirconia, especially fully stabilized zirconia and a material containing a major component of partially stabilized zirconia, in view of the high mechanical strength and the high toughness.

The thin plate sections 12a, 12b are the parts which are driven in accordance with the displacement of the piezoelectric/electrostrictive elements 18a, 18b as described above. Each of the thin plate sections 12a, 12b is a thin plate-shaped member having flexibility. The thin plate sections 12a, 12b function to amplify the expansion and contracting displacement of the piezoelectric/electrostrictive element 18a, 18b arranged on the surface to obtain the bending displacement which is transmitted to the movable sections 20a, 20b. Therefore, as for the shape and the material quality of the thin plate section 12a, 12b, it is enough to use those having flexibility and having mechanical strength to such an extent that no breakage occurs due to any bending deformation. The shape and the material quality of the thin plate sections 12a, 12b can be appropriately selected in consideration of the response performance and the operability of the thin plate sections 12a, 12b.

Ceramics can be preferably used for the material for constituting the thin plate sections 12a, 12b, in the same manner as for the movable sections 20a, 20b and the fixed section 14. A material containing a major component of zirconia, especially fully stabilized zirconia, and a material containing a major component of partially stabilized zirconia are used most preferably, because the mechanical strength is large even when the wall thickness is thin, the toughness is high, and the reactivity with the piezoelectric/electrostrictive layer 22 and the electrode material is small.

The fully stabilized zirconia and the partially stabilized zirconia are preferably fully stabilized or partially stabilized as follows. That is, compounds which fully stabilize and/or partially stabilize zirconia include yttrium oxide, ytterbium oxide, cerium oxide, calcium oxide, and magnesium oxide. Zirconia can be stabilized as desired, by adding and containing at least one of the foregoing compounds, or by adding the foregoing compounds in combination as well, while there is no limitation to only the addition of one compound.

It is desirable that the respective compounds are added in the following amounts, i.e., 1 to 30 mole %, preferably 1.5 to 10 mole % in the case of yttrium oxide or ytterbium oxide, 6 to 50 mole %, preferably 8 to 20 mole % in the case of cerium oxide, and 5 to 40 mole %, preferably 5 to 20 mole % in the case of calcium oxide or magnesium oxide. Among them, it is especially preferable to use yttrium oxide as a stabilizer. In this case, it is desirable that yttrium oxide is preferably added in an amount of 1.5 to 10 mole %, and more preferably 2 to 4 mole %. It is possible to add, for example, alumina, silica, and/or oxide of transition metal as an additive of a sintering aid or the like within a range of 0.05 to 20% by weight. However, when a technique for forming the piezoelectric/electrostrictive elements 18a, 18b is adopted, i.e., when the piezoelectric/electrostrictive elements 18a, 18b are formed by sintering and integrating materials into one unit by the film formation method, then it is also preferable to add, for example, alumina, magnesia, and/or oxide of transition metal as an additive.

In order to obtain high mechanical strength and stable crystal phase, it is desirable that the average crystal grain diameter of zirconia is 0.05 to 3 μm, preferably 0.05 to 1 μm. As described above, ceramics, which are equivalent to those used for the movable sections 20a, 20b and the fixed section 14, can be used for the thin plate sections 12a, 12b. However, the thin plate sections 12a, 12b are preferably constructed by using substantially the same material, which is advantageous in order that the reliability of the joined portions is improved, the strength of the piezoelectric/electrostrictive device 10 is enhanced, and the complexity of production is reduced.

Each of the piezoelectric/electrostrictive elements 18a, 18b has at least the piezoelectric/electrostrictive layer 22 and the pair of electrodes 24, 26 for applying the electric field to the piezoelectric/electrostrictive layer 22. It is possible to use, for example, piezoelectric/electrostrictive elements of the unimorph type and the bimorph type. However, the piezoelectric/electrostrictive element of the unimorph type, which is combined with the thin plate section 12a, 12b, is more excellent in stability of the generated displacement amount, and it is more advantageous to reduce the weight. Therefore, the piezoelectric/electrostrictive element of the unimorph type is suitable for the piezoelectric/electrostrictive device 10 as described above.

It is preferable that the piezoelectric/electrostrictive elements 18a, 18b are formed on the side surfaces of the thin plate sections 12a, 12b as shown in FIG. 1, since the thin plate sections 12a, 12b can be driven more greatly.

Piezoelectric ceramics are preferably used for the piezoelectric/electrostrictive layer 22. However, it is also possible to use electrostrictive ceramics, ferroelectric ceramics, and anti-ferroelectric ceramics. However, when the piezoelectric/electrostrictive device 10 is used to position the magnetic head of the hard disk drive, for example, it is preferable to use a material having small strain hysteresis, and it is preferable to use a material having a coercive electric field of 10 kV/mm or less, because the linearity between the displacement amount of the thin plate section 12a, 12b and the driving voltage or the output voltage is considered to be important.

Specified materials include ceramics containing, for example, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and/or strontium bismuth tantalite singly or as a mixture.

In particular, a material containing lead zirconate, lead titanate, or lead magnesium niobate as a major component, or a material containing sodium bismuth titanate as a major component is preferably used, since such a material has a high electromechanical coupling factor and a high piezoelectric constant, the reactivity with the thin plate section (ceramics) 12a, 12b is small when the piezoelectric/electrostrictive layer 22 is sintered, and a stable composition is obtained.

It is also preferable to use ceramics obtained by adding, to the material described above, any single one of or a mixture of, for example, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and stannum.

For example, when lanthanum and/or strontium is contained in major components of lead zirconate, lead titanate, and lead magnesium niobate, an advantage is obtained in some cases, for example, such that the coercive electric field and the piezoelectric characteristics are adjustable.

It is desirable to avoid the addition of a material such as silica which tends to form glass, for the following reason. That is, the material such as silica is readily reacted with the piezoelectric/electrostrictive material during the heat treatment for the piezoelectric/electrostrictive layer 22. As a result, the composition is varied, and the piezoelectric characteristics are deteriorated.

On the other hand, it is preferable that the pair of electrodes 24, 26 of the piezoelectric/electrostrictive element 18a, 18b are composed of a metal which is solid at room temperature and which is excellent in conductivity. It is possible to use, for example, metal simple substances such as aluminum, titanium, chromium, iron, cobalt, nickel, copper, zinc, niobium, molybdenum, ruthenium, palladium, rhodium, silver, stannum, tantalum, tungsten, iridium, platinum, gold, and lead, and alloys thereof. Further, it is also preferable to use a cermet material obtained by dispersing the same materials as those of the piezoelectric/electrostrictive layer 22 and/or the thin plate sections 12a, 12b therein.

The material of the electrodes 24, 26 of the piezoelectric/electrostrictive element 18a, 18b is selected and determined depending on the method for forming the piezoelectric/electrostrictive layer 22. For example, when the piezoelectric/electrostrictive layer 22 is formed by the sintering on the electrode 24 after forming the first electrode 24 on the thin plate section 12a, 12b, it is necessary for the first electrode 24 to use a high melting point metal such as platinum, palladium, platinum-palladium alloy, or silver-palladium alloy which does not change at the sintering temperature of the piezoelectric/electrostrictive layer 22. However, the second electrode 26, which is disposed at the outermost layer and which is formed on the piezoelectric/electrostrictive layer 22 after forming the piezoelectric/electrostrictive layer 22, can be formed as an electrode at a low temperature. Therefore, it is possible to use a low melting point metal as a major component including, for example, aluminum, gold, and silver.

Each of the thicknesses of the electrodes 24, 26 may be a factor to considerably decrease the displacement of the piezoelectric/electrostrictive element 18a, 18b. Therefore, especially for the electrode to be formed after the sintering of the piezoelectric/electrostrictive layer 22, it is preferable to use a material such as an organic metal paste with which a dense and thinner film can be obtained after the sintering, including, for example, gold resinate paste, platinum resinate paste, and silver resinate paste.

The piezoelectric/electrostrictive device 10 according to this embodiment can be preferably used for a variety of sensors including, for example, ultrasonic wave sensors, acceleration sensors, angular velocity sensors, shock sensors, and mass sensors. The piezoelectric/electrostrictive device 10 according to this embodiment is further advantageous in that the sensitivity of the sensor can be easily adjusted by appropriately adjusting the size of an object to be attached between the end surfaces 32a, 32b or between the thin plate sections 12a, 12b.

As for the method for forming the piezoelectric/electrostrictive element 18a, 18b on the surface of the ceramic laminate in the method for producing the piezoelectric/electrostrictive device 10, it is possible to use the screen printing method described above as well as a thick film formation method such as the dipping method, the application method, and the electrophoresis method and a thin film formation method such as the ion beam method, the sputtering method, the vacuum deposition, the ion plating method, the chemical vapor deposition method (CVD), and plating.

When the piezoelectric/electrostrictive elements 18a, 18b are formed by using any one of the film formation methods as described above, the piezoelectric/electrostrictive elements 18a, 18b and the thin plate sections 12a, 12b can be joined and arranged integrally without using any adhesive. It is possible to secure the reliability and the reproducibility, and it is possible to facilitate the integration thereof.

In the present embodiment, it is preferable that the piezoelectric/electrostrictive elements 18a, 18b are formed by the thick film formation method, for the following reason. That is, when the thick film formation method is used especially for the formation of the piezoelectric/electrostrictive layer 22, the film can be formed by using, for example, a paste, a slurry, a suspension, an emulsion, or a sol containing, as a major component, grains or powder of piezoelectric ceramics having an average grain diameter of 0.01 to 5 $\mu$m, preferably 0.05 to 3 $\mu$m. When the film obtained as described above is sintered, it is possible to obtain good piezoelectric/electrostrictive characteristics.

The electrophoresis method is advantageous in that the film can be formed at a high density with a high shape accuracy. The screen printing method is advantageous to simplify the production steps, because the film formation and the pattern formation can be performed simultaneously.

The method of cutting the ceramic laminate includes mechanical machining such as dicing machining and wire saw machining as well as electron beam machining and laser machining by using, for example, the YAG laser and the excimer laser.

Figure 15:
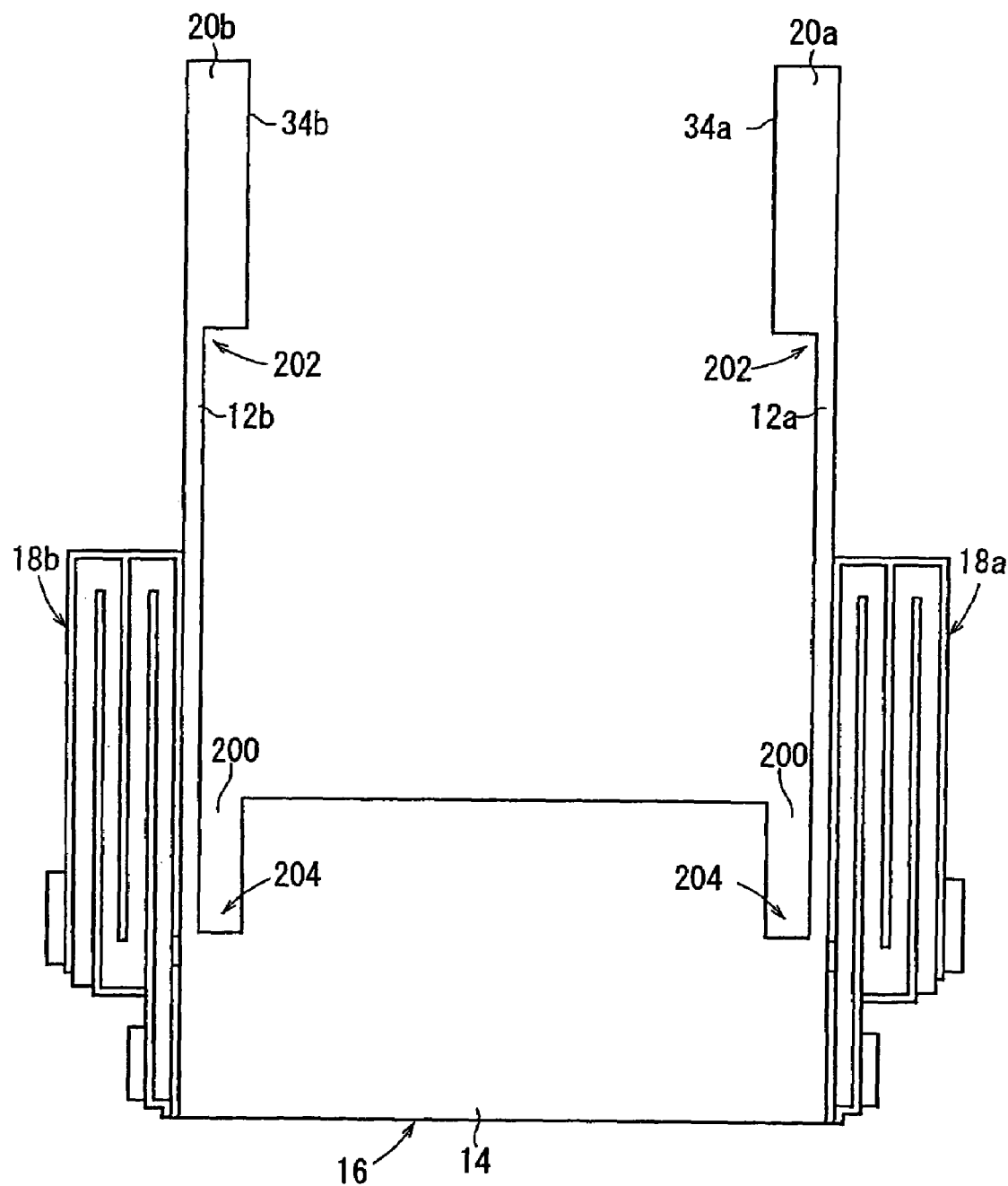
FIG. 15 is a front view illustrating a piezoelectric/electrostrictive device according to a modified embodiment.

When the ceramic substrate 16 is constructed, for example, as shown in FIG. 15, cutouts (cutaways) 200 are sometimes formed in the vicinity of the thin plate sections 12a, 12b respectively on the inner wall of the fixed section 14 (piezoelectric/electrostrictive device 10a according to a modified embodiment). Accordingly, the lengths of the pair of thin plate sections 12a, 12b are substantially lengthened, and it is possible to obtain large displacement amounts. Further, the thin plate sections 12a, 12b are more flexible, and hence it is also possible to reduce the electric power consumption. The embodiment shown in FIG. 15 is illustrative of a state in which the first wiring pattern 50 is formed to have approximately the same length as that of the stacked portion of the piezoelectric/electrostrictive element 18a, 18b without forming the first wiring pattern 50 up to the upper end of the thin plate section 12a, 12b.

However, it is feared that the stress may be concentrated on the joined portions 202 between the thin plate sections 12a, 12b and the movable sections 20a, 20b and on the joined portions 204 between the thin plate sections 12a, 12b and the fixed section 14, and the shock resistance of the piezoelectric/electrostrictive device 10a may be deteriorated.

In view of the above, specified embodiments of the preferred structure of the piezoelectric/electrostrictive device 10 according to the embodiment of the present invention will be described below with reference to FIGS. 16 to 24.

Figure 16:
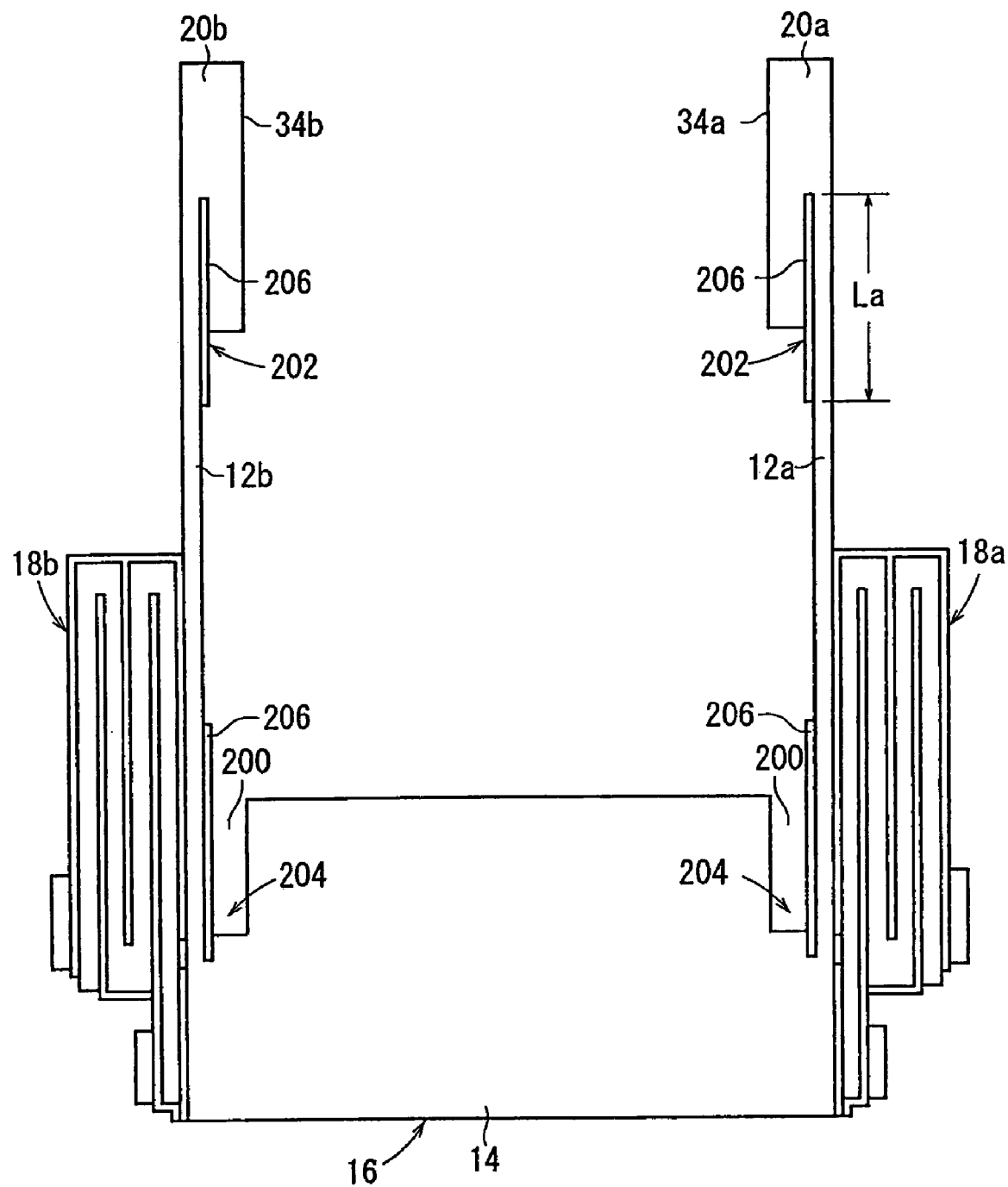
FIG. 16 is a front view illustrating a piezoelectric/electrostrictive device according to a first specified embodiment.

As shown in FIG. 16, a piezoelectric/electrostrictive device 10A according to a first specified embodiment is constructed in approximately the same manner as the piezoelectric/electrostrictive device 10a according to the modified embodiment shown in FIG. 15 described above. However, the piezoelectric/electrostrictive device 10A according to the first embodiment differs in that additional members 206, each of which is based on a second material, are arranged at the joined portions 202 between the thin plate sections 12a, 12b and the movable sections 20a, 20b and at the joined portions 204 between the thin plate sections 12a, 12b and the fixed section 14. Those usable as the second material include metals and materials containing metals.

Usually, the ceramics have high breaking strength against the compressive stress, but the breaking strength of the ceramics is low against the tensile stress. On the other hand, the metal has the high breaking strength against the tensile stress, but the metal tends to be deformed, for example, bent by the compressive stress, and the strength of the metal to maintain the shape is low against the compressive stress. However, the metal is not broken unlike the ceramics. In other words, the metal has such a property that the metal tends to cause the elastic deformation, and the amount of allowance of the elastic deformation before causing the breakage is large as compared with the ceramics. Therefore, when the two materials (ceramics and metal) are combined, then it is possible to mutually supplement the drawbacks of the both, and it is possible to secure the high strength.

Further, when the metal is arranged on the surface, then the metal causes the elastic deformation in response to the tensile stress, and the metal absorbs the stress. Therefore, the fracture limitation is raised, and the breaking strength is increased as compared with a case in which the ceramics is exposed to the surface. In particular, it is possible to enhance the shock resistance.

In the first specified embodiment, the additional members 206 are arranged at the joined portions 202 between the thin plate sections 12a, 12b and the movable sections 20a, 20b and at the joined portions 204 between the thin plate sections 12a, 12b and the fixed section 14. Therefore, when the additional member 206 is composed of metal, it is possible to obtain the function and the effect as described above. That is, the stress concentration is usually caused at the joined portions 202, 204. However, when the additional member 206, which is softer than the ceramics, is expanded and contracted, then the shock, which is brought about by the stress concentration, is absorbed, and it is possible to enhance the shock resistance.

When the additional member 206 is composed of the metal having a high elastic modulus, it is advantageous to enhance the shock resistance as described above. However, it is feared that the metal may be exfoliated from the ceramic substrate 16. Accordingly, the material for constituting the additional member 206 is not limited to the metal as described above. Alternatively, the additional member 206 may be composed of a cermet containing metal. In this arrangement, there is no fear of exfoliation because of the high joining strength with respect to the ceramics.

That is, the material for constituting the additional member 206 is required to have the following characteristics. (1) The elastic modulus is higher than that of the ceramics, similarly to the metal. (2) The coefficient of thermal expansion is approximate to that of the ceramics which is the principal material for the ceramic substrate 16. (3) The adhesion strength (joining strength) with respect to the ceramics is high. The material, which has the characteristics as described above, may be exemplified by a cermet of metal and the constitutive material (ceramics) of the ceramic substrate 16.

As for the metal, it is preferable to use noble metals such as Pt capable of being co-fired together with the ceramics at a high temperature. However, it is also allowable to use, for example, titanium, chromium, and nickel. Zirconia is preferred as the ceramics.

When the ratio of the metal in the cermet is low, then the joining strength with respect to the ceramics is raised, but the property as the metal becomes poor. Therefore, it is impossible to expect the improvement in strength so much. According to this fact, it is preferable to select a condition in which the ratio of the metal is high and it is possible to secure the joining strength with respect to the ceramics. Therefore, the blending ratio of the cermet is such that the metal is preferably 0.5 to 1 and more preferably 0.7 to 0.9 provided that the ceramics is 1 in volume ratio.

When the piezoelectric/electrostrictive device 10A including the additional members 206 as described above is manufactured, it is enough to add only a step of pattern-printing a cermet paste to be converted into the additional members 206 thereafter during the process for manufacturing the ceramic green laminate 58 as described above (see FIG. 5).

That is, the green sheets corresponding to the thin plate sections 12a, 12b are processed to have the predetermined shapes by the method including, for example, the punching out based on the use of a die or laser machining, and then patterns based on the cermet paste having a predetermined thickness are formed by using the screen printing at predetermined positions (positions corresponding to the joined portions 202 between the thin plate sections 12a, 12b and the movable sections 20a, 20b and the joined portions 204 between the thin plate sections 12a, 12b and the fixed section 14 in this embodiment) on the surfaces (surfaces on which the pair of thin plate sections 12a, 12b are opposed to one another) to serve as the back surfaces of the thin plate sections 12a, 12b.

Methods other than the printing method may be also adopted. That is, patterns may be formed by spray by using masking, or a green sheet of cermet may be manufactured, followed by performing the punching out so that obtained pieces are stacked to form the additional members.

The thickness of the cermet paste is preferably 0.003 to 0.07 mm and more preferably 0.005 to 0.01 mm, for the following reason. That is, if the thickness is thinner than 0.03 mm, the effect to improve the breaking strength is poor. If the thickness is thicker than 0.07 mm, then the entire thin plate section 12a, 12b is too thick, and a harmful influence is caused such that the displacement amount is decreased. Therefore, it is preferable that the thickness of the ceramic portion at the portion for forming the cermet paste and the thickness of the cermet paste to be formed are appropriately adjusted to optimize the characteristics of the piezoelectric/electrostrictive device while taking the balance with the breaking strength into consideration.

The length for inserting the additional member 206 into the joined portion 202, 204 (conveniently referred to as "insertion length") La is preferably the thickness or more of the thin plate section 12a, 12b (thickness of the ceramic portion), for the following reason. That is, if the insertion length La is too short, then the strict positioning accuracy is required during the pattern printing and the lamination, and it is feared that the yield may be lowered.

Figure 17:
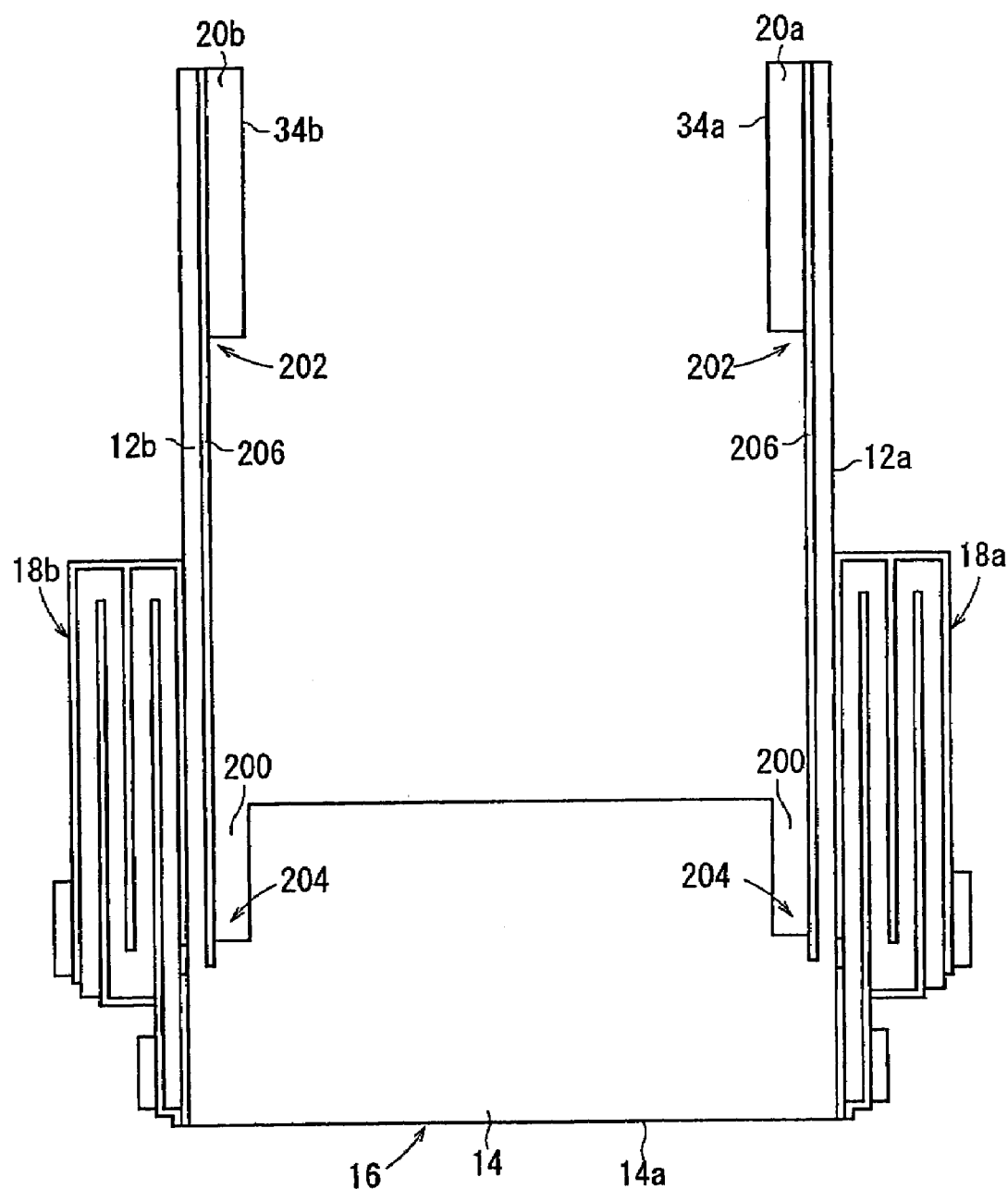
FIG. 17 is a front view illustrating a piezoelectric/electrostrictive device according to a second specified embodiment.

Next, as shown in FIG. 17, a piezoelectric/electrostrictive device 10B according to a second specified embodiment is constructed in approximately the same manner as the piezoelectric/electrostrictive device 10A according to the first specified embodiment shown in FIG. 16 described above. However, the piezoelectric/electrostrictive device 10B according to the second specified embodiment differs in that additional members 206 are arranged continuously along the back surfaces (surfaces on which the pair of thin plate sections 12a, 12b are opposed to one another) of the thin plate sections 12a, 12b over ranges from the upper ends of the movable sections 20a, 20b to the outer end surface 14a of the fixed section 14.

In this arrangement, it is possible to avoid breakage of the ceramics (for example, any occurrence of cracks and fracture) which would be otherwise caused from the back surfaces of the thin plate sections 12a, 12b, in addition to the function and the effect of the piezoelectric/electrostrictive device 10A according to the first specified embodiment.

Figure 18:
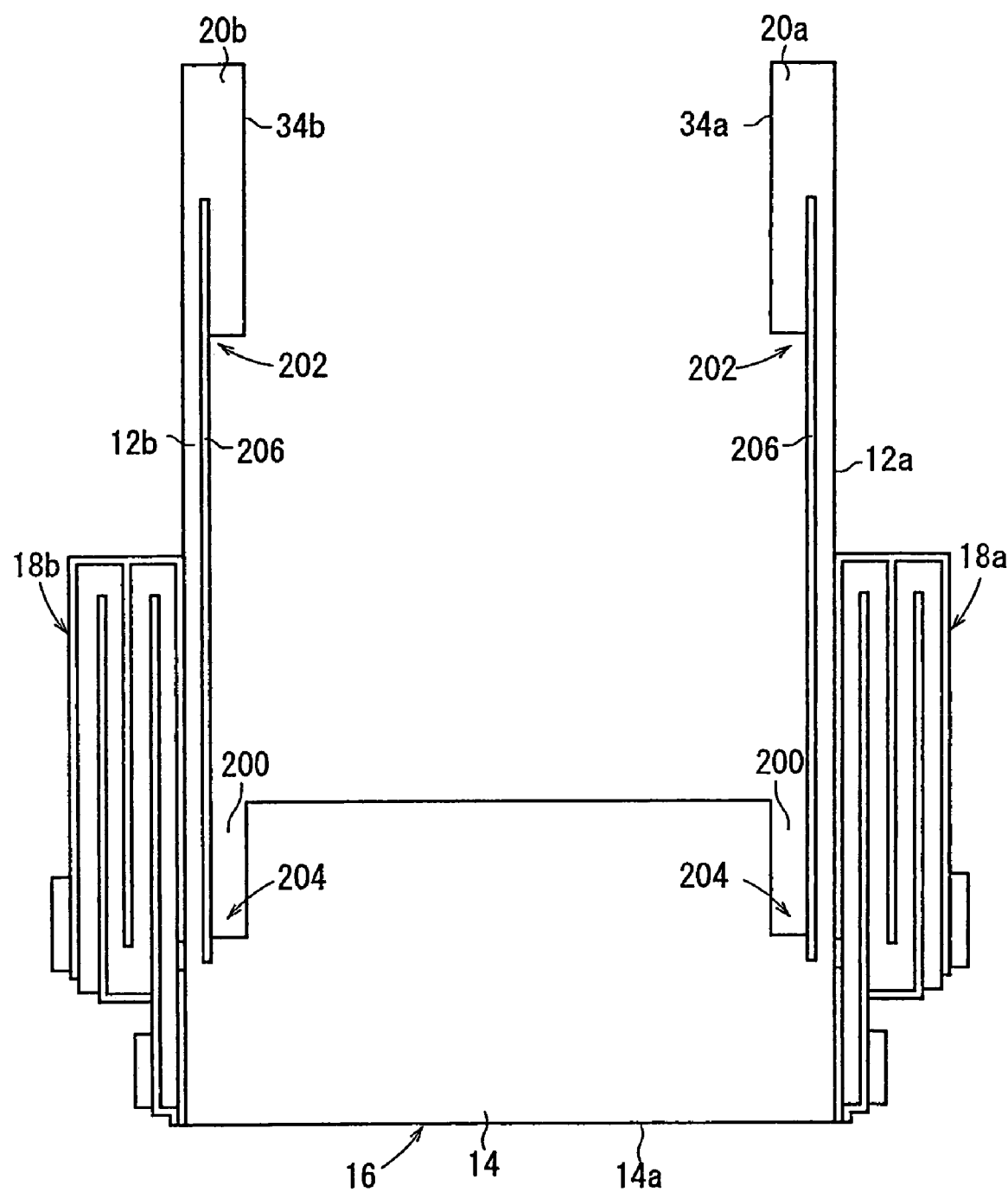
FIG. 18 is a front view illustrating a piezoelectric/electrostrictive device according to a third specified embodiment.

Next, as shown in FIG. 18, a piezoelectric/electrostrictive device 10C according to a third specified embodiment is constructed in approximately the same manner as the piezoelectric/electrostrictive device 10B according to the second specified embodiment shown in FIG. 17 described above. However, the piezoelectric/electrostrictive device 10C according to the third specified embodiment differs in that additional members 206 are arranged continuously over ranges from the joined portions 202 between the thin plate sections 12a, 12b and the movable sections 20a, 20b to the joined portions 204 between the thin plate sections 12a, 12b and the fixed section 14.

In this arrangement, the ceramic substrate 16 is not completely divided by the additional members 206, but the ceramic substrate 16 is partially connected. Accordingly, an advantage is obtained such that the additional members 206 are hardly exfoliated even by the stress caused, for example, by the difference in thermal expansion. Therefore, it is possible to improve the reliability in relation to the thermal shock such as the quick heating and the quick cooling.

Figure 19:
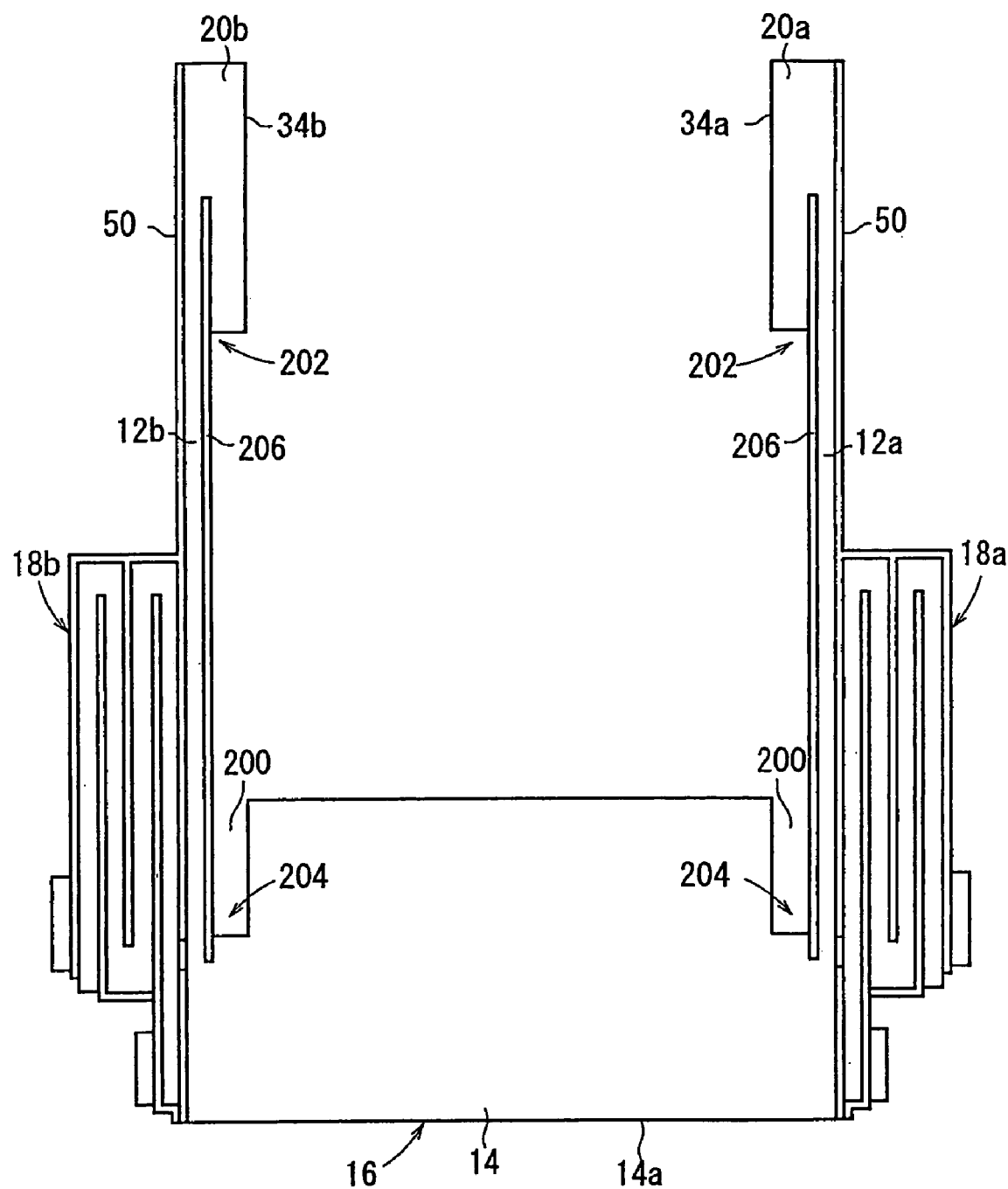
FIG. 19 is a front view illustrating a piezoelectric/electrostrictive device according to a fourth specified embodiment.

Next, as shown in FIG. 19, a piezoelectric/electrostrictive device 10D according to a fourth specified embodiment is constructed in approximately the same manner as the piezoelectric/electrostrictive device 10C according to the third specified embodiment shown in FIG. 18 described above. However, the piezoelectric/electrostrictive device 10D according to the fourth specified embodiment differs in that first wiring patterns 50 of the piezoelectric/electrostrictive elements 18a, 18b are formed to extend up to the upper ends of the thin plate sections 12a, 12b respectively.

In this arrangement, it is possible to avoid the breakage of the ceramics which would be otherwise caused from the front surfaces (side surfaces) of the thin plate sections 12a, 12b, in addition to the fact that it is possible to avoid the breakage of the ceramics (for example, any occurrence of cracks and fracture) which would be otherwise caused from the back surfaces of the thin plate sections 12a, 12b.

Figure 20:
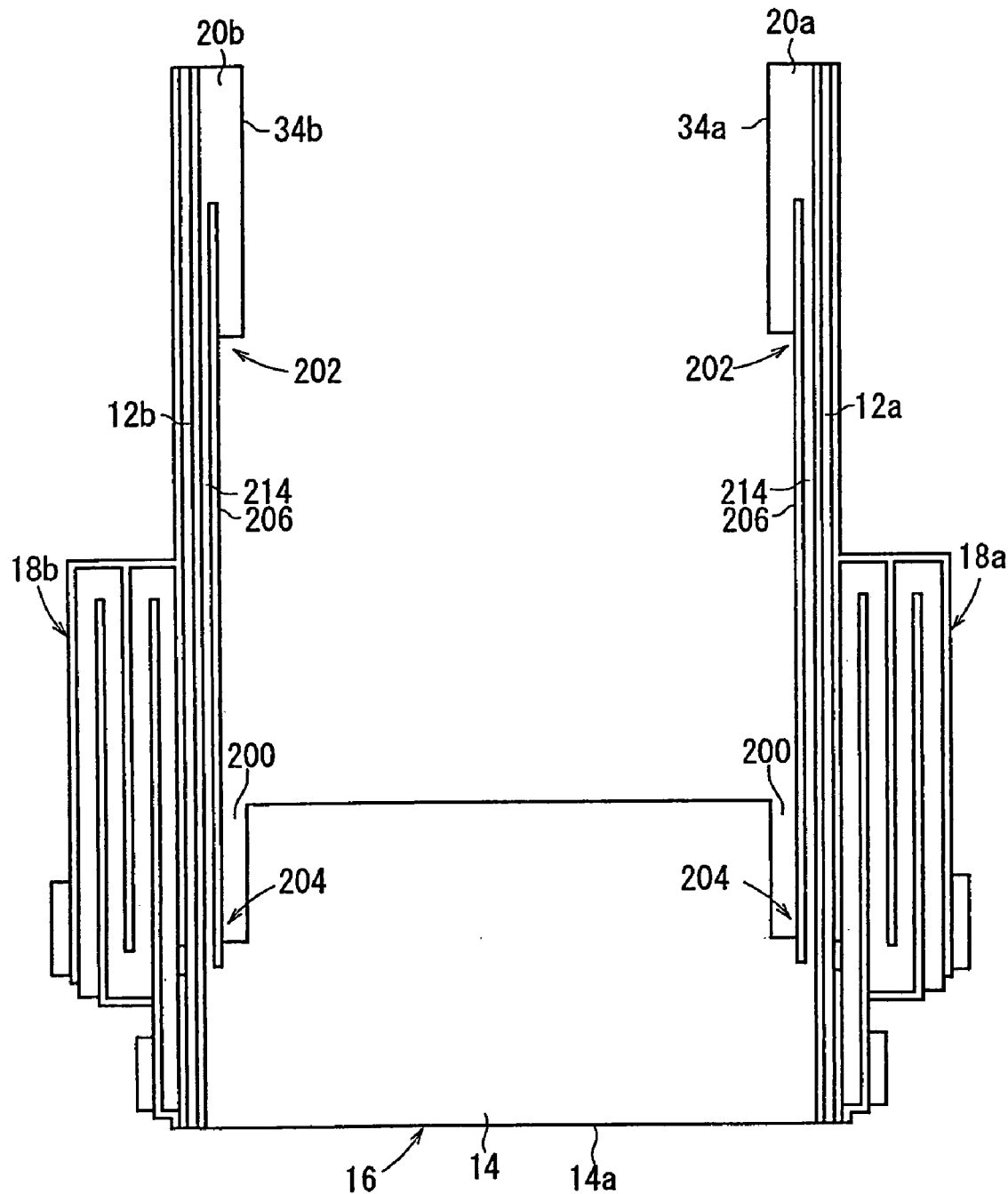
FIG. 20 is a front view illustrating a piezoelectric/electrostrictive device according to a fifth specified embodiment.

Next, as shown in FIG. 20, a piezoelectric/electrostrictive device 10E according to a fifth specified embodiment is constructed in approximately the same manner as the piezoelectric/electrostrictive device 10D according to the fourth specified embodiment shown in FIG. 19 described above. However, the piezoelectric/electrostrictive device 10E according to the fifth specified embodiment differs in that second additional members 214 are arranged at approximately intermediate portions in the thickness direction of the respective thin plate sections 12a, 12b respectively. Constitutive materials, which are equivalent to those of the additional members 206, can be used for the second additional members 214.

In this arrangement, the second additional members 214 composed of metal or the like are inserted into the approximately intermediate portions in the thickness direction of the thin plate sections 12a, 12b. Therefore, the second additional members 214 bring about the function and the effect which are similar to those brought about by the reinforcing rods of the reinforced concrete of the building. Thus, it is possible to further enhance the strength.

Figure 21:
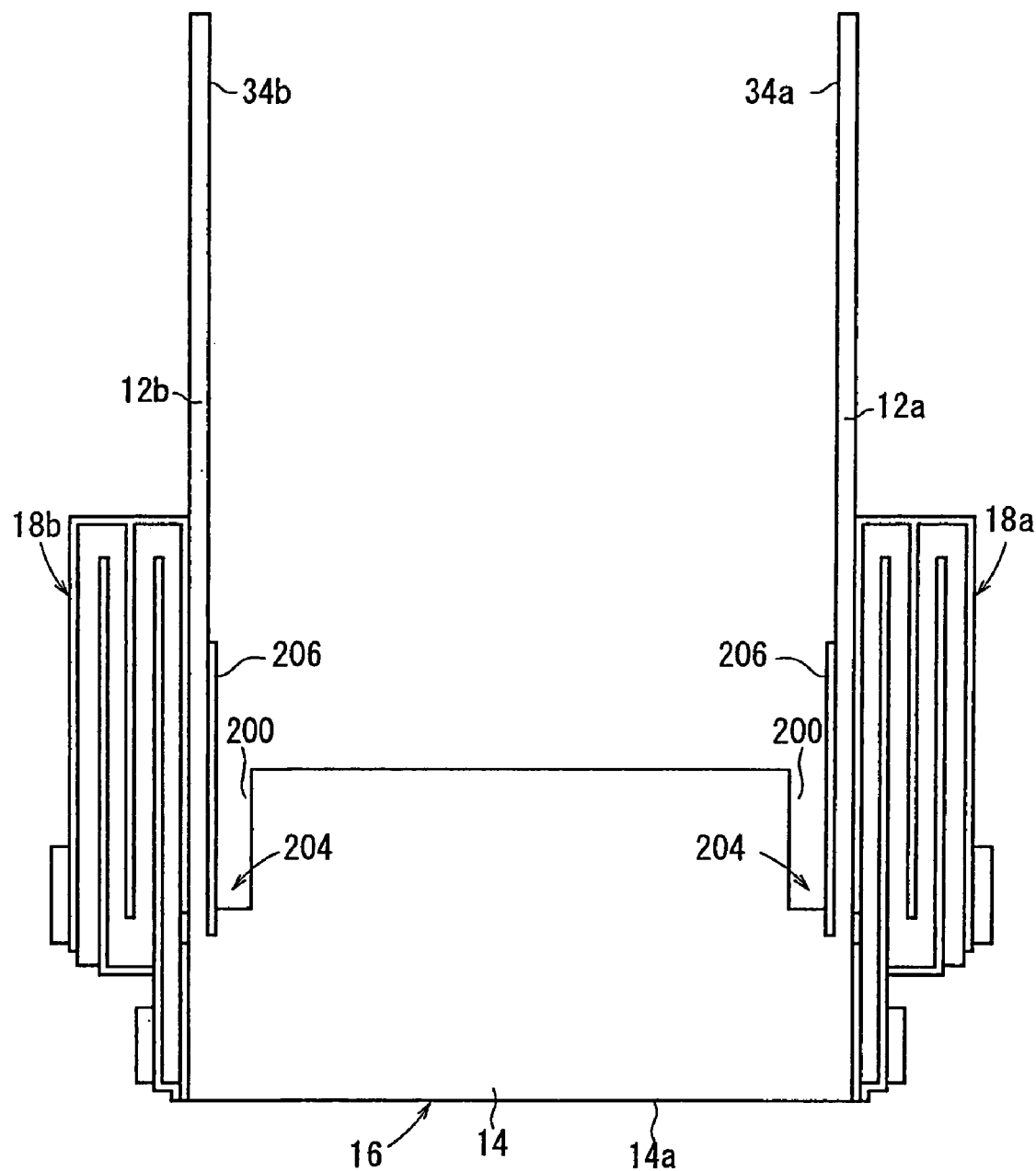
FIG. 21 is a front view illustrating a piezoelectric/electrostrictive device according to a sixth specified embodiment.

Next, as shown in FIG. 21, a piezoelectric/electrostrictive device 10F according to a sixth specified embodiment is constructed in approximately the same manner as the piezoelectric/electrostrictive device 10C according to the third specified embodiment shown in FIG. 18 described above. However, the piezoelectric/electrostrictive device 10F according to the sixth specified embodiment differs in that the forward end portions of the thin plate sections 12a, 12b are not thick-walled and the thicknesses of the forward end portions are approximately the same as the thicknesses of intermediate portions of the thin plate sections 12a, 12b and that additional members 206 are formed at only the joined portions 204 between the thin plate sections 12a, 12b and the fixed section 14. In this arrangement, the opposing surfaces of the forward end portions of the thin plate sections 12a, 12b function as attachment surfaces 34a, 34b for an object.

According to this arrangement, no thick-walled portion exists at the forward end portions of the thin plate sections 12a, 12b, and the stress concentration is scarcely caused. Therefore, it is possible to improve the shock resistance.

Figure 22:
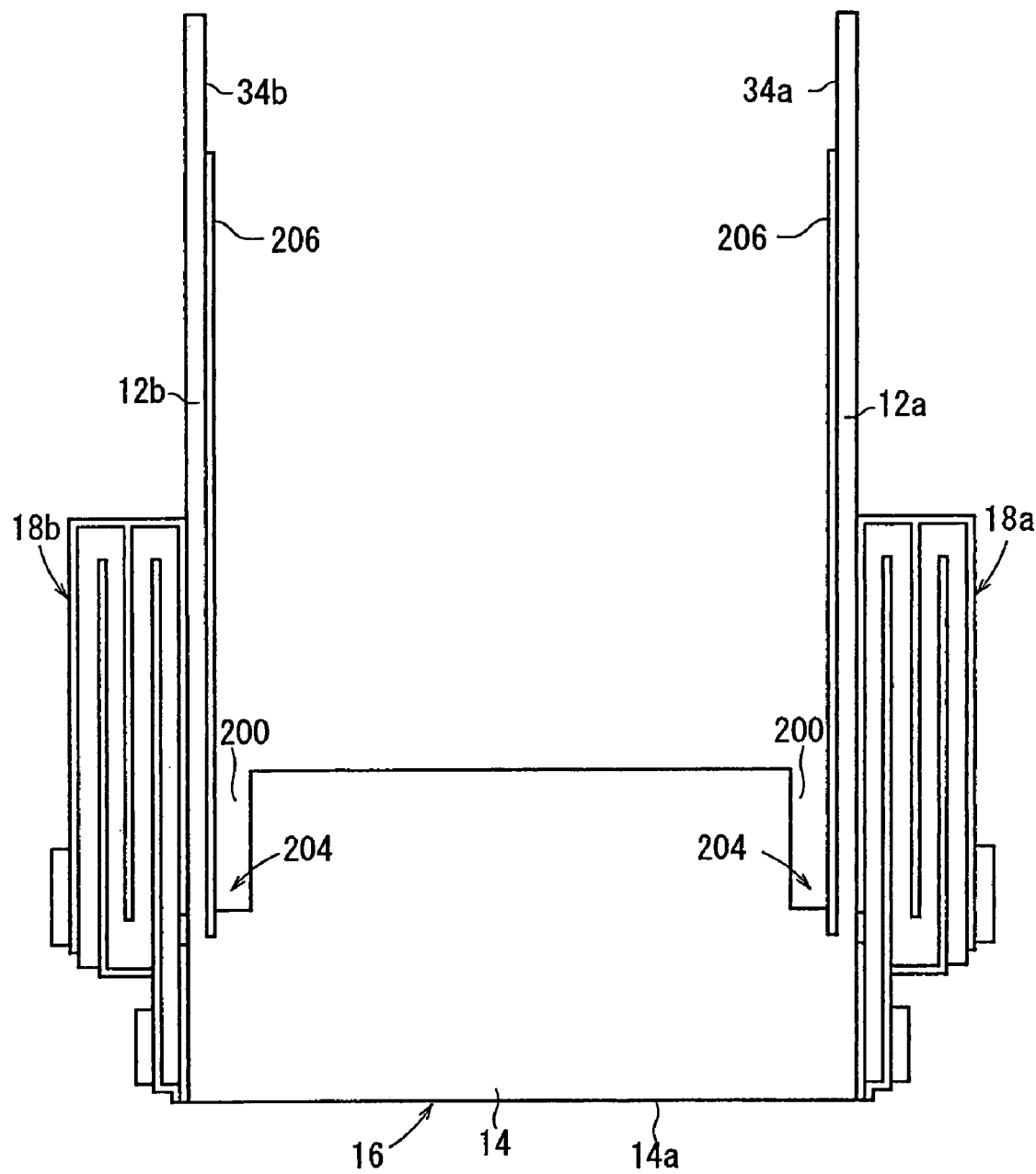
FIG. 22 is a front view illustrating a piezoelectric/electrostrictive device according to a seventh specified embodiment.

Next, as shown in FIG. 22, a piezoelectric/electrostrictive device 10G according to a seventh specified embodiment is constructed in approximately the same manner as the piezoelectric/electrostrictive device 10F according to the sixth specified embodiment shown in FIG. 21 described above. However, the piezoelectric/electrostrictive device 10G according to the seventh specified embodiment differs in that additional members 206 are formed to extend along the back surfaces of the thin plate sections 12a, 12b up to portions in the vicinity of the attachment surfaces 34a, 34b. In this arrangement, it is possible to avoid the breakage of the ceramics (for example, any occurrence of cracks and fracture) which would be otherwise caused from the back surfaces of the thin plate sections 12a, 12b in addition to the function and the effect of the piezoelectric/electrostrictive device 10F according to the sixth specified embodiment.

Figure 23:
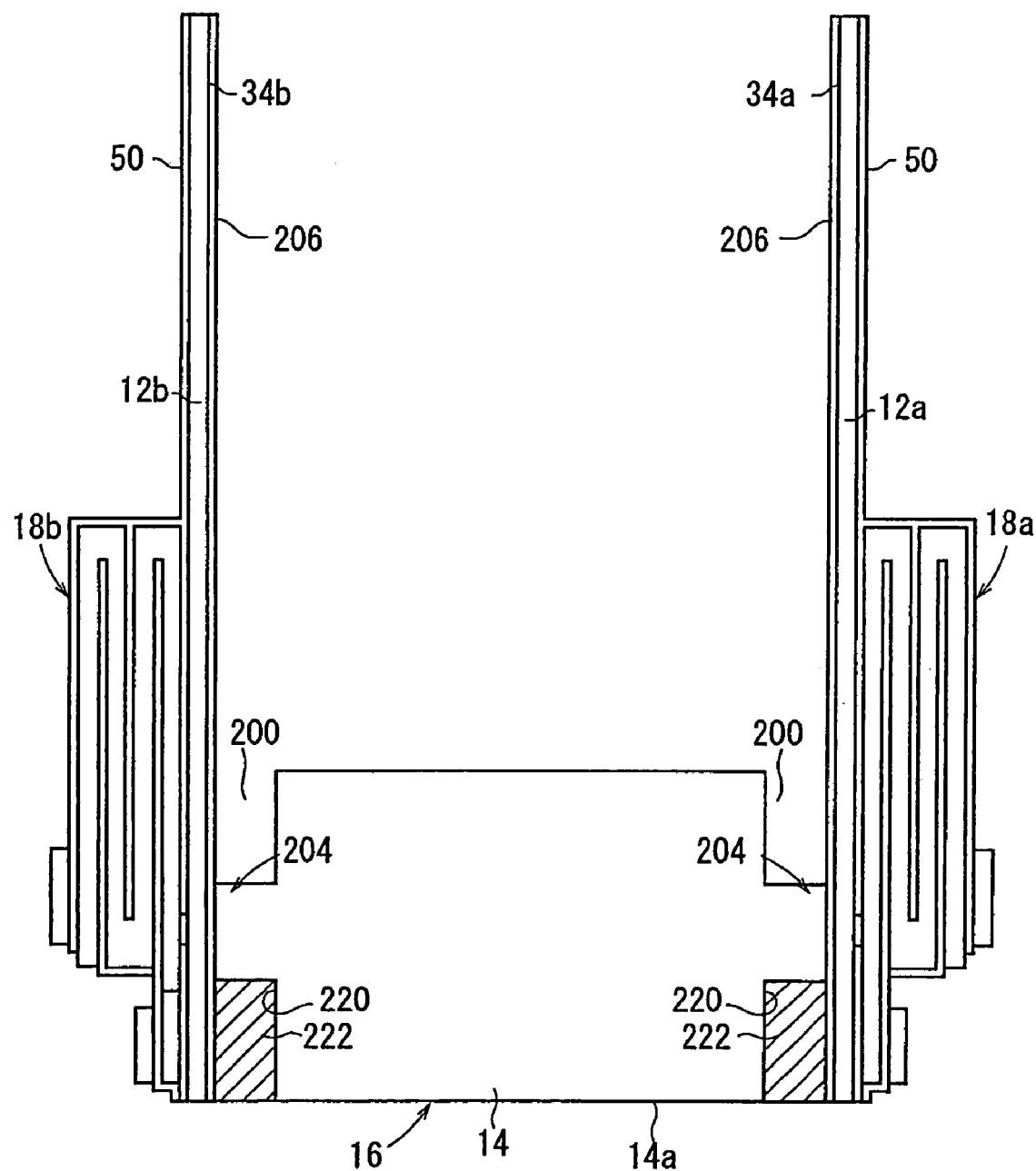
FIG. 23 is a front view illustrating a piezoelectric/electrostrictive device according to an eighth specified embodiment.
Figure 24:
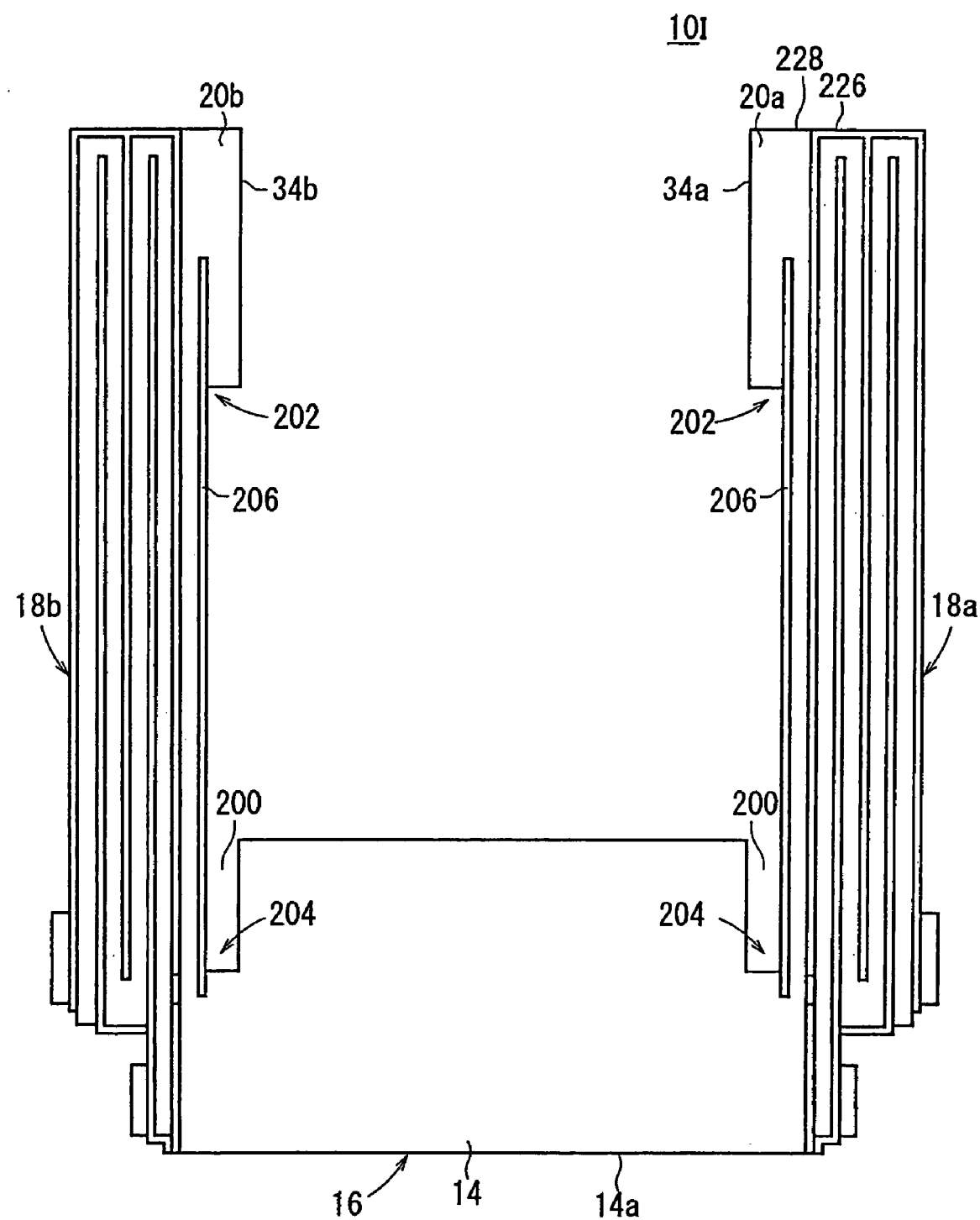
FIG. 24 is a front view illustrating a piezoelectric/electrostrictive device according to a ninth specified embodiment.

Next, as shown in FIG. 23, a piezoelectric/electrostrictive device 10H according to an eighth specified embodiment is constructed in approximately the same manner as the piezoelectric/electrostrictive device 10G according to the seventh specified embodiment shown in FIG. 22 described above. However, the piezoelectric/electrostrictive device 10H according to the eighth specified embodiment differs in that additional members 206 are formed continuously along the back surfaces of the thin plate sections 12a, 12b over ranges from the forward ends of the thin plate sections 12a, 12b to the outer end surface 14a of the fixed section 14 and the first wiring patterns 50 are formed to extend up to the forward ends of the thin plate sections 12a, 12b and that distinct cutouts 220 are formed at portions of the outer end surface 14a of the fixed section 14 corresponding to the cutouts 200 formed on the inner wall of the fixed section 14.

In this arrangement, it is possible to increase the displacement amounts of the forward end portions of the thin plate sections 12a, 12b. However, it is feared that any exfoliation may be caused, because the connecting portions between the fixed section 14 and the thin plate sections 12a, 12b are small in area. Accordingly, the exfoliation of the thin plate sections 12a, 12b can be effectively avoided by filling the distinct cutouts 220 with a resin 222 as shown by hatched lines in FIG. 23.

The length of the piezoelectric/electrostrictive element 18a, 18b (length along the thin plate section 12a, 12b) may be short as in the piezoelectric/electrostrictive devices 10A to 10H according to the first to eight specified embodiments shown in FIGS. 16 to 23. Alternatively, as illustrated by a piezoelectric/electrostrictive device 10I according to a ninth specified embodiment shown in FIG. 24, the length of the piezoelectric/electrostrictive element 18a, 18b may be lengthened so that first end surfaces 226 of the respective piezoelectric/electrostrictive elements 18a, 18b are disposed at approximately the same positions as those of first end surfaces 228 of the movable sections 20a, 20b respectively.

The piezoelectric/electrostrictive devices 10, 10a, 10A to 10I described above are usable as various transducers, various actuators, frequency region functional parts (filters), transformers, and active devices including, for example, vibrators, resonators, oscillators, and discriminators for communication and power generation as well as sensor devices including, for example, ultrasonic sensors, acceleration sensors, angular velocity sensors, shock sensors, and mass sensors. In particular, the piezoelectric/electrostrictive devices 10, 10a, 10A to 10I described above are preferably usable for various actuators to be used for mechanisms for adjusting the angle and adjusting the positioning and the displacement of, for example, various precision parts such as optical instruments and precision instruments.

As explained above, the following effects are obtained by the piezoelectric/electrostrictive device according to the present invention and the method of manufacturing the same.

(1) It is possible to increase the occupied area of a conductive portion in one electrode layer, and it is possible to increase the driving force, improve the yield, and realize the easy control.

(2) It is possible to effectively reduce the volume of a piezoelectric/electrostrictive element itself to decrease the resistance on the displacement action, and it is possible to further increase the driving force (increase the displacement amount).

(3) It is possible to prevent a piezoelectric/electrostrictive element formed on a ceramic substrate from exfoliation, it is possible to reduce the number of steps in relation to the production of the piezoelectric/electrostrictive device, it is possible to improve the throughput, and it is possible to avoid the deterioration of function of the piezoelectric/electrostrictive device.

(4) It is possible to improve the shock resistance by increasing the breaking strength and it is possible to provide a piezoelectric/electrostrictive device which has high reliability.

What is claimed is:

1. A piezoelectric/electrostrictive device comprising a ceramic substrate and at least a piezoelectric/electrostrictive element stacked on said ceramic substrate, wherein
    said piezoelectric/electrostrictive element includes a plurality of piezoelectric/electrostrictive layers and a plurality of electrode layers stacked alternately in a comb like structure on said ceramic substrate, said electrode layers include one or more intermediate electrode layers at an intermediate portion of said piezoelectric/electrostrictive element,
    said intermediate electrode layers include metal electrode layers interposed between said piezoelectric/electrostrictive layers and cermet electrode layers not interposed between said piezoelectric/electrostrictive layers, and
    said metal electrode layers and said cermet electrode layers are connected to one another.

2. The piezoelectric/electrostrictive device according to claim 1, wherein said metal electrode layers are thinner than said cermet electrode layers.

3. The piezoelectric/electrostrictive device according to claim 1, wherein one or more gaps of one or more lower electrode layers positioned at a lower portion of said piezoelectric/electrostrictive element are formed on said ceramic substrate and are filled with an insulating layer.

4. The piezoelectric/electrostrictive device according to claim 1, wherein one or more upper electrode layers provided at an upper portion of said piezoelectric/electrostrictive element are formed by depositing a film of resinate of a conductive material to said upper portion.

* * * * *